(12) United States Patent
Cho et al.

(10) Patent No.: US 12,389,585 B2
(45) Date of Patent: Aug. 12, 2025

(54) METHOD OF FABRICATING A SEMICONDUCTOR MEMORY DEVICE

(71) Applicant: SAMSUNG ELECTRONICS CO., LTD., Suwon-si (KR)

(72) Inventors: Gihee Cho, Yongin-si (KR); Jungoo Kang, Seoul (KR); Hyun-Suk Lee, Suwon-si (KR); Sanghyuck Ahn, Daegu (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 648 days.

(21) Appl. No.: 17/701,866

(22) Filed: Mar. 23, 2022

(65) Prior Publication Data

US 2022/0216209 A1 Jul. 7, 2022

Related U.S. Application Data

(62) Division of application No. 16/903,586, filed on Jun. 17, 2020, now Pat. No. 11,342,329.

(30) Foreign Application Priority Data

Nov. 1, 2019 (KR) .................. 10-2019-0138567

(51) Int. Cl.
*H10B 12/00* (2023.01)
*H01L 21/02* (2006.01)
*H10D 1/68* (2025.01)

(52) U.S. Cl.
CPC ....... *H10B 12/03* (2023.02); *H01L 21/02186* (2013.01); *H10B 12/30* (2023.02); *H10D 1/692* (2025.01)

(58) Field of Classification Search
CPC ... H01L 21/02186; H01L 28/40; H01L 28/60; H01L 29/92; H10B 12/02; H10B 12/03; H10B 12/033; H10B 12/30; H10B 12/315; H10D 1/62; H10D 1/68; H10D 1/692
See application file for complete search history.

(56) References Cited

U.S. PATENT DOCUMENTS

| | | |
|---|---|---|
| 5,286,668 A | 2/1994 | Chou |
| 8,236,372 B2 | 8/2012 | Krishnan et al. |
| 8,476,141 B2 | 7/2013 | Malhotra et al. |
| 8,574,998 B2 | 11/2013 | Malhotra et al. |
| 8,741,712 B2 | 6/2014 | Chiang et al. |
| 9,997,591 B2 | 6/2018 | Lee et al. |
| 10,784,362 B2 | 9/2020 | Lu et al. |
| 2008/0272421 A1 | 11/2008 | Bhat |

(Continued)

FOREIGN PATENT DOCUMENTS

| | | |
|---|---|---|
| CN | 109727870 A | 5/2019 |
| JP | 2003-017581 A | 1/2003 |

(Continued)

*Primary Examiner* — Britt D Hanley
*Assistant Examiner* — Kevin Quinto
(74) *Attorney, Agent, or Firm* — Morgan, Lewis & Bockius LLP

(57) ABSTRACT

A semiconductor memory device includes a capacitor having a bottom electrode and a top electrode, a dielectric layer between the bottom and top electrodes, and an interface layer between the top electrode and the dielectric layer, the interface layer including a metal oxide and an additional constituent at a grain boundary of the interface layer.

13 Claims, 23 Drawing Sheets

(56) References Cited

U.S. PATENT DOCUMENTS

| | | |
|---|---|---|
| 2011/0303971 A1 | 12/2011 | Lee et al. |
| 2012/0119327 A1 | 5/2012 | Kwon et al. |
| 2013/0143379 A1 | 6/2013 | Malhotra et al. |
| 2015/0357399 A1 | 12/2015 | Cho et al. |
| 2016/0087028 A1 | 3/2016 | Hirota et al. |
| 2017/0352666 A1 | 12/2017 | Ahn et al. |
| 2018/0005836 A1 | 1/2018 | Lim et al. |
| 2020/0105633 A1* | 4/2020 | Lee ............... H01L 23/291 |

FOREIGN PATENT DOCUMENTS

| | | |
|---|---|---|
| JP | 5385723 B2 | 10/2013 |
| JP | 2014-044993 A | 3/2014 |
| JP | 2014-229680 A | 12/2014 |
| KR | 10-1152390 B1 | 6/2012 |
| KR | 10-1455003 B1 | 10/2014 |
| KR | 10-2017-0030708 A | 3/2017 |
| KR | 10-1819756 B1 | 2/2018 |

\* cited by examiner

METHOD OF FABRICATING A SEMICONDUCTOR MEMORY DEVICE

CROSS-REFERENCE TO RELATED APPLICATION

This application is a division of U.S. patent application Ser. No. 16/903,586 filed on Jun. 17, 2020, which is incorporated by reference herein in its entirety.

Korean Patent Application No. 10-2019-0138567, filed on Nov. 1, 2019, in the Korean Intellectual Property Office, and entitled: "Semiconductor Memory Device and Method of Fabricating the Same," is incorporated by reference herein in its entirety.

BACKGROUND

1. Field

The present disclosure relates to a semiconductor, and more particularly, to a semiconductor memory device and a method of fabricating the same.

2. Description of the Related Art

Semiconductor devices are beneficial in the electronic industry because of their small size, multi-functionality, and/or low fabrication cost. In particular, the semiconductor devices are being highly integrated with the remarkable development of the electronic industry. For example, line widths of patterns of semiconductor devices are being reduced for high integration thereof.

SUMMARY

According to some example embodiments, a semiconductor memory device may include a capacitor having a bottom electrode and a top electrode, a dielectric layer between the bottom and top electrodes, and an interface layer between the top electrode and the dielectric layer, the interface layer including a metal oxide and an additional constituent at a grain boundary of the interface layer.

According to some example embodiments, a semiconductor memory device may include a capacitor having a bottom electrode, a dielectric layer on the bottom electrode, a top electrode on the dielectric layer, and an upper interface layer between the dielectric layer and the top electrode. The upper interface layer may include a metal oxide and an additional constituent contained in the metal oxide. The additional constituent may have a maximum amount of about 5 at %.

According to some example embodiments, a semiconductor memory device may include a capacitor connected to a transistor on a substrate. The capacitor may include a plurality of bottom electrodes that are supported by a support pattern connected to sidewalls of the bottom electrodes adjacent to the support pattern, a top electrode on the bottom electrodes, a dielectric layer between the top electrode and the bottom electrodes, the dielectric layer extending along surfaces of the bottom electrodes, and an upper interface layer between the dielectric layer and the top electrode. The upper interface layer may include a metal oxide and an additional constituent capable of being present at a grain boundary in the upper interface layer. The metal oxide may include titanium oxide (TiOx). The additional constituent may include aluminum (Al), silicon (Si), or a combination thereof.

According to some example embodiments, a method of fabricating a semiconductor memory device may include forming a capacitor bottom electrode on a substrate, forming a capacitor dielectric layer on the capacitor bottom electrode, forming an upper interface layer on the capacitor dielectric layer, and forming a top electrode on the upper interface layer. The upper interface layer may include a metal oxide and an additional constituent doped into the metal oxide. The additional constituent may be capable of being present at a grain boundary of the metal oxide.

According to some example embodiments, a method of fabricating a semiconductor memory device may include providing a substrate on which are formed a plurality of bottom electrodes that are connected to each other through a support pattern, forming on the bottom electrodes a dielectric layer that continuously extends along surfaces of the bottom electrodes and a surface of the support pattern, forming on the dielectric layer an upper interface layer that continuously extends along the bottom electrodes and the support pattern, and forming on the upper interface layer a top electrode that covers the bottom electrodes. The upper interface layer may include a titanium oxide and an additional constituent capable of being present at a grain boundary of the titanium oxide. The additional constituent may have a maximum amount of about 5 at %.

DETAILED DESCRIPTION OF EMBODIMENTS

Figure 1A:
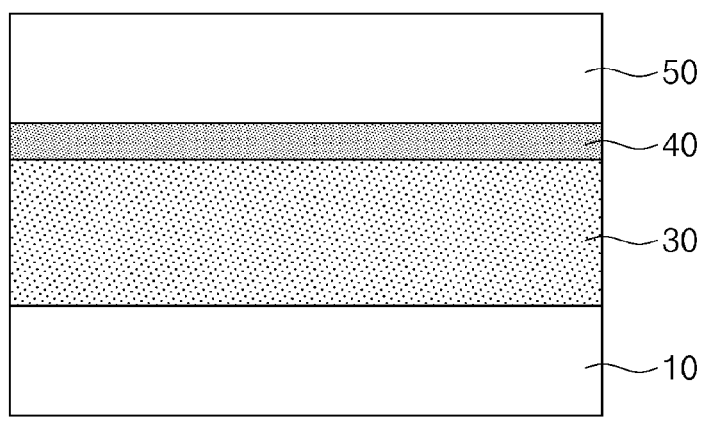
FIG. 1A illustrates a cross-sectional view of a capacitor according to some example embodiments.
Figure 1B:
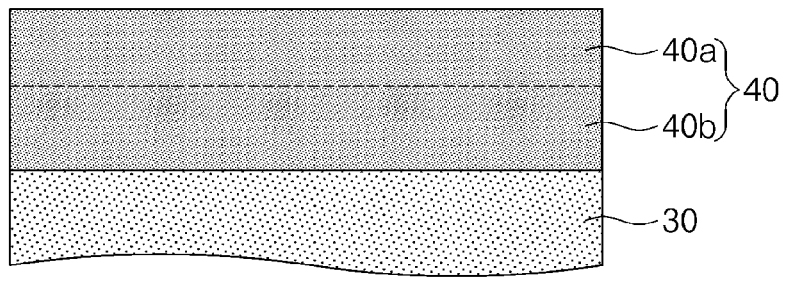
FIG. 1B illustrates a cross-sectional view of a method of forming an interface layer included in a capacitor according to some example embodiments.
Figure 1C:
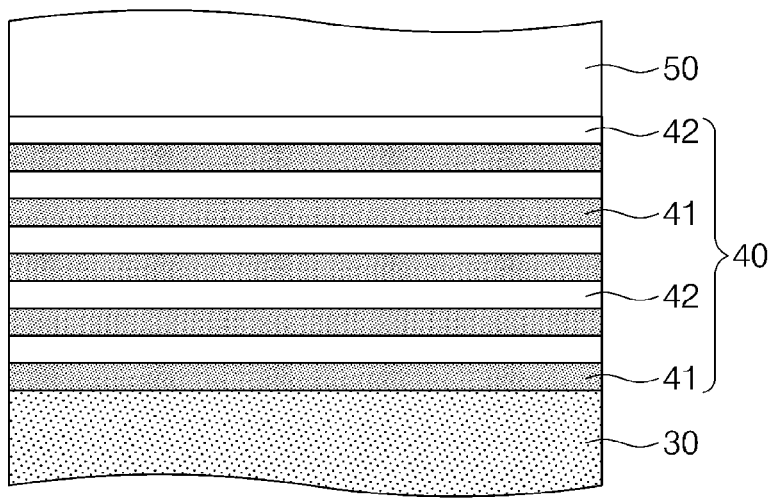
FIG. 1C illustrates a cross-sectional view of a method of forming an interface layer included in a capacitor according to some example embodiments.
Figure 1D:
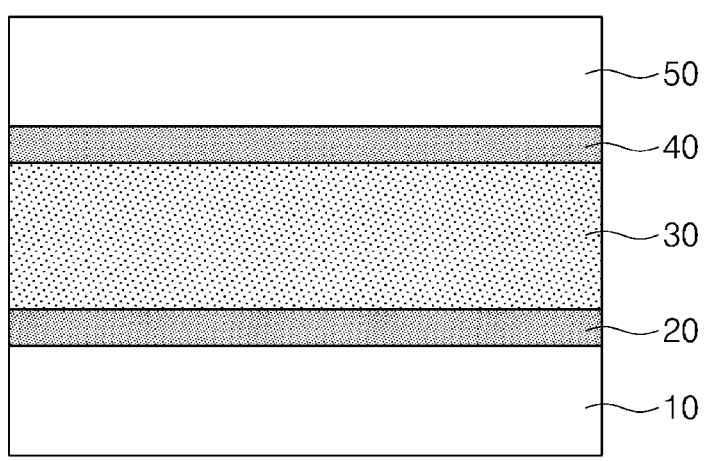
FIG. 1D illustrates a cross-sectional view of a capacitor according to some example embodiments.

FIG. 1A illustrates a cross-sectional view of a capacitor according to some example embodiments. FIG. 1B illustrates a cross-sectional view of a method of forming an interface layer included in a capacitor according to some example embodiments. FIG. 1C illustrates a cross-sectional view of another method of forming an interface layer included in a capacitor according to some example embodiments. FIG. 1D illustrates a cross-sectional view of a capacitor according to some example embodiments.

Referring to FIG. 1A, a capacitor 1 may include a bottom electrode 10, a dielectric layer 30 on the bottom electrode 10, a top electrode 50 opposite to the bottom electrode 10 across the dielectric layer 30, and an interface layer 40 between the top electrode 50 and the dielectric layer 30. The bottom electrode 10 and the top electrode 50 may independently include one or more of an impurity-doped polysilicon layer, an impurity-doped silicon-germanium layer, a metal nitride layer, e.g., a titanium nitride layer or a hafnium nitride layer, and a metal layer including metal, e.g., tungsten, copper, or aluminum. The dielectric layer 30 may include an oxide layer of, e.g., hafnium (Hf), niobium (Nb), titanium (Ti), tantalum (Ta), zirconium (Zr), chromium (Cr), cobalt (Co), iridium (Ir), molybdenum (Mo), osmium (Os), rhenium (Re), rhodium (Rh), ruthenium (Ru), tungsten (W), vanadium (V), or any combination thereof.

The interface layer 40 may include a metal oxide, and further include an additional constituent, e.g., a metallic or semiconductor constituent. The interface layer 40 may have semiconductor properties. For example, the interface layer 40 may include titanium oxide (e.g., TiOx) as the metal oxide, and further include aluminum (Al), silicon (Si), or a combination thereof as the additional constituent. For example, the interface layer 40 may have a composition of AlTiO$_2$ or SiTiO$_2$.

The additional constituent of the interface layer 40 may have an amount of about 5 at % or less, based on a total amount of the interface layer 40. The additional constituent may be present at a pathway, e.g., a grain boundary, along which charges move, and may serve to prevent charges from traveling along a grain boundary of the interface layer 40. For this reason, the dielectric layer 30 may maintain its dielectric constant, and the capacitor 1 may suppress its current leakage, with the result that the capacitor 1 may have high capacitance. In addition, the additional constituent may complement the grain boundary of the interface layer 40, and it may thus be possible to substantially reduce or prevent damage to the dielectric layer 30 in a subsequent process.

The interface layer 40 may have a bulk structure or a single-layered structure. For example, the additional constituent may have a uniform concentration in the interface layer 40. In another example, the additional constituent may have a non-uniform concentration in the interface layer 40. For example, when the additional constituent includes aluminum (Al), the aluminum may have a concentration that gradually decreases along a direction oriented from the top electrode 50 toward the dielectric layer 30.

The interface layer 40 may be formed as discussed below. The following formation is a mere example, and the present disclosure is not limited thereto.

For example, referring to FIG. 1B, the interface layer 40 may be formed as a single layer including metal oxide and particles of the additional constituent element. For example, a base layer 40a may be provided on the dielectric layer 30 that is formed by depositing a metal oxide. The base layer 40a may be formed of a metal oxide (e.g., TiO$_2$) that is deposited by a deposition process, e.g., a chemical vapor deposition (CVD), a physical vapor deposition (PVD), or an atomic layer deposition (ALD), on the dielectric layer 30. Next, an oxide with the additional constituent, e.g., aluminum oxide (e.g., Al$_2$O$_3$), may be deposited on the base layer 40a by a deposition process, e.g., a chemical vapor deposition (CVD), a physical vapor deposition (PVD), or an atomic layer deposition (ALD), thereby forming an additional layer 40b. For example, as illustrated in FIG. 1B, the additional layer 40b may cover an entire exposed surface of the base layer 40a, e.g., to improve coverage of a grain boundary along the entire base layer 40a. For example, during the deposition of the additional layer 40b, the additional constituent (e.g. aluminum (Al)) may diffuse into the base layer 40a, e.g., through the base layer 40a toward the dielectric layer 30. In another example, an annealing process may be separately performed to diffuse the additional constituent into the base layer 40a.

Therefore, the finalized interface layer 40 may be formed to have a bulk structure in which a concentration gradient of the additional constituent is present or absent. For example, the finalized interface layer 40 may include the base layer 40a with particles of the additional layer 40b diffused therein in uniform or non-uniform distribution, e.g., the two separate layers 40a and 40b in FIG. 1B are merely a schematic representation of separate deposition operations rather than the finalized interface layer 40.

In another example, aluminum (Al) may be deposited simultaneously with the metal oxide (e.g., TiO$_2$) on the dielectric layer 30 to form the base layer 40a. This process may therefore form the interface layer 40, i.e., the base layer 40a doped with aluminum (Al), on the dielectric layer 30 without the additional layer 40b.

Referring to FIG. 1C, the interface layer 40 may have a multi-layered or laminated structure in which at least one first layer 41 and at least one second layer 42 are alternately and repeatedly deposited on the dielectric layer 30. The first layer 41 and the second layer 42 may have different constituents from each other or the same or similar constituent.

In some embodiments, the first layer 41 may be formed by depositing a metal oxide, e.g., TiO$_2$, and the second layer 42 may be formed by depositing an aluminum-containing material, e.g., Al$_2$O$_3$, AlN, AlC, or any combination thereof. For example, a lowermost first layer 41 may be adjacent to or in contact with the dielectric layer 30, and an uppermost second layer 42 may be adjacent to or in contact with the top electrode 50. In another example, a lowermost first layer 41 and an uppermost first layer 41 may be adjacent to or in contact with the dielectric layer 30 and the top electrode 50, respectively. In yet another example, a lowermost second layer 42 and an uppermost second layer 42 may be adjacent to or in contact with the dielectric layer 30 and the top electrode 50, respectively. In still another example, a lowermost second layer 42 may be adjacent to or in contact with the dielectric layer 30, and an uppermost first layer 41 may be adjacent to or in contact with the top electrode 50. In some embodiments, the first and second layers 41 and 42 may be formed by depositing titanium aluminum oxide (e.g., TiAlO). For example, each of the first and second layers 41 and 42 may be deposited by a deposition process, e.g., the first and second layers 41 and 42 may completely cover each other.

Referring to FIG. 1D, the capacitor 1 may further include an interface layer 20 (referred to hereinafter as a lower interface layer) between the dielectric layer 30 and the bottom electrode 10 in addition to the interface layer 40 (referred to hereinafter as an upper interface layer) between the top electrode 50 and the dielectric layer 30. The lower interface layer 20 may be formed by the same or similar method used for forming the upper interface layer 40.

The lower interface layer 20 may have an identical or similar structure to that of the upper interface layer 40. For example, the lower interface layer 20 may include a metal oxide (e.g., TiOx), and further include an additional constituent such as a metallic constituent (e.g., aluminum (Al)) or a semiconductor constituent (e.g., silicon (Si)). The additional constituent may have an amount of about 5 at % or less of a total amount of the lower interface layer 20, and may prevent charges from moving through a grain boundary of the lower interface layer 20, e.g., as the grain boundary of the lower interface layer 20 imparts crystallinity to the dielectric layer 30 to improve the dielectric constant and completely separates between the dielectric layer 30 and the bottom electrode 10.

For example, the lower interface layer 20 may be formed identically or similarly to that discussed with reference to FIG. 1B, thereby having a bulk structure. The additional constituent may have a concentration that is constant or gradually decreases or increases along a direction oriented from the dielectric layer 30 toward the bottom electrode 10. For example, in each of the upper and lower interface layers 40 and 20, the additional constituent may have a concentration that gradually decreases along a downward direction from the top electrode 50 toward the bottom electrode 10, e.g., in accordance with a diffusion profile of the additional constituent controlled by heat during the deposition or annealing processes. In another example, the additional constituent may have a concentration that gradually decreases along the downward direction in the upper interface layer 40, and that gradually increases along the downward direction in the lower interface layer 20.

In another example, the lower interface layer 20 may be formed identically or similarly to that discussed with reference to FIG. 1C, thereby having a laminated structure. The description with reference to FIG. 1C may be applicable identically or similarly to the lower interface layer 20. As such, the upper and lower interface layers 40 and 20 may have the same structure or a mirror image, e.g., symmetry, with respect to the dielectric layer 30.

Figure 2A:
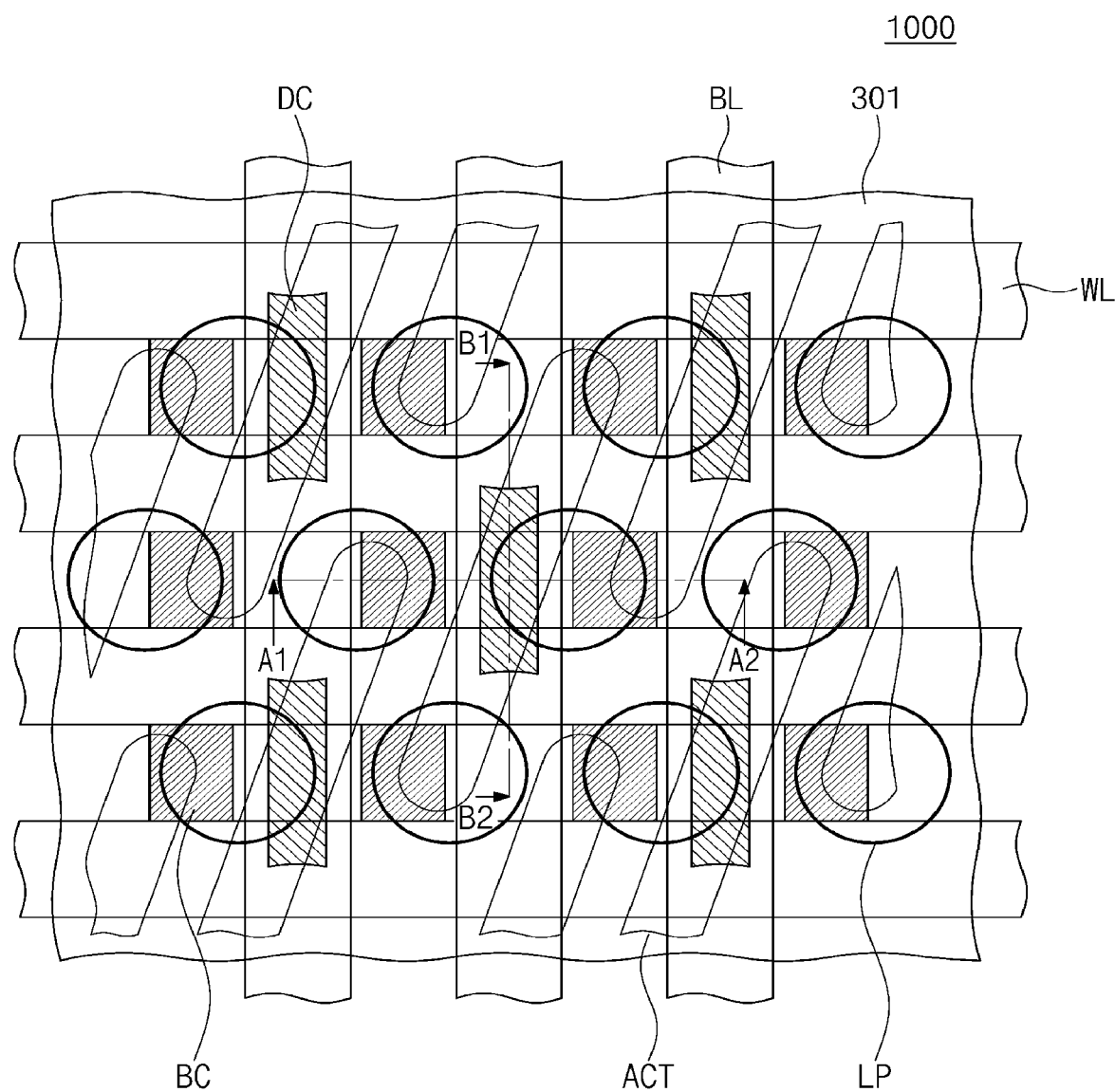
FIG. 2A illustrates a plan view showing a semiconductor memory device that includes a capacitor according to some example embodiments.
Figure 2B:
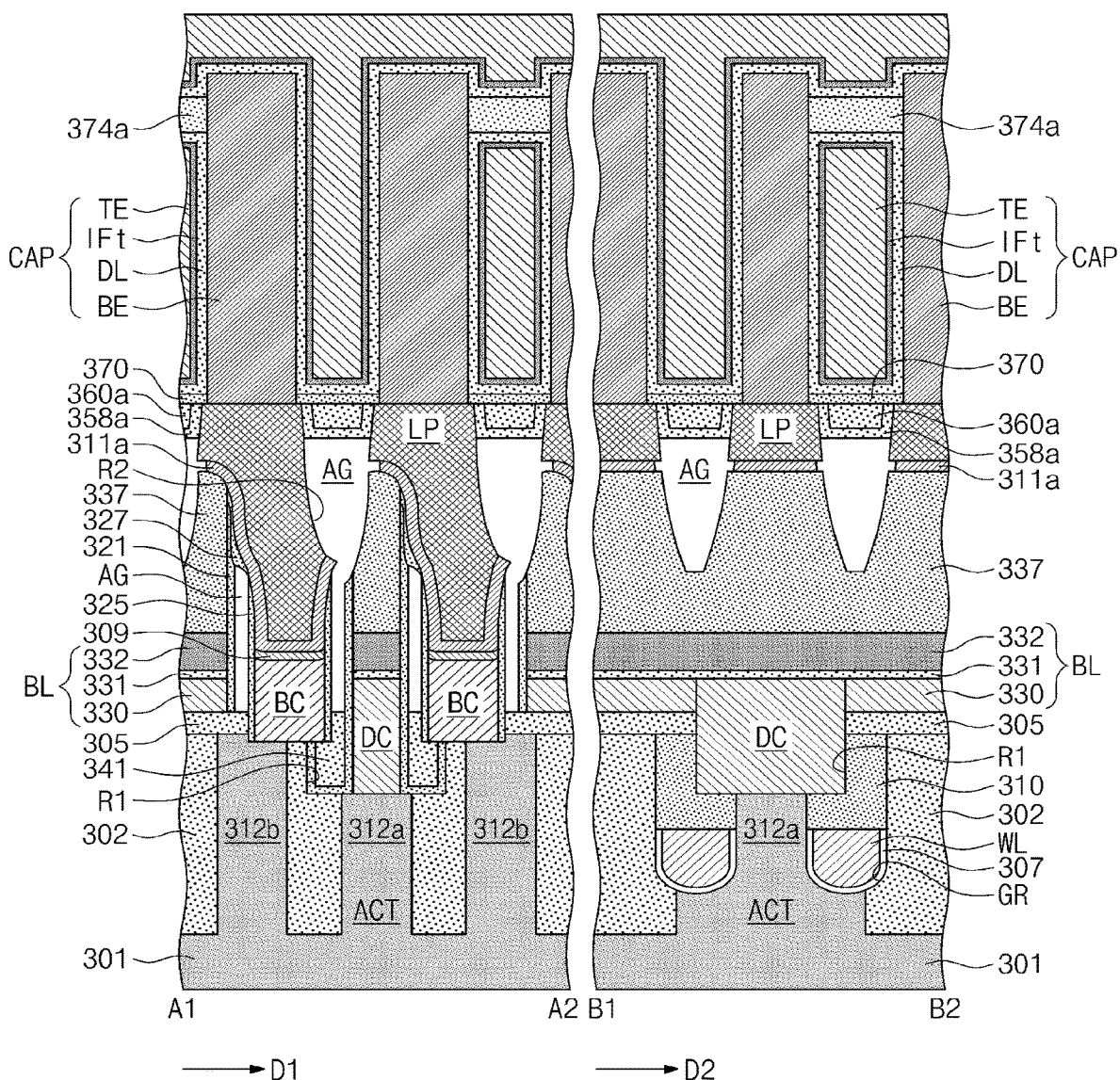
FIG. 2B illustrates a cross-sectional view along lines A1-A2 and B1-B2 of FIG. 2A.
Figure 2C:
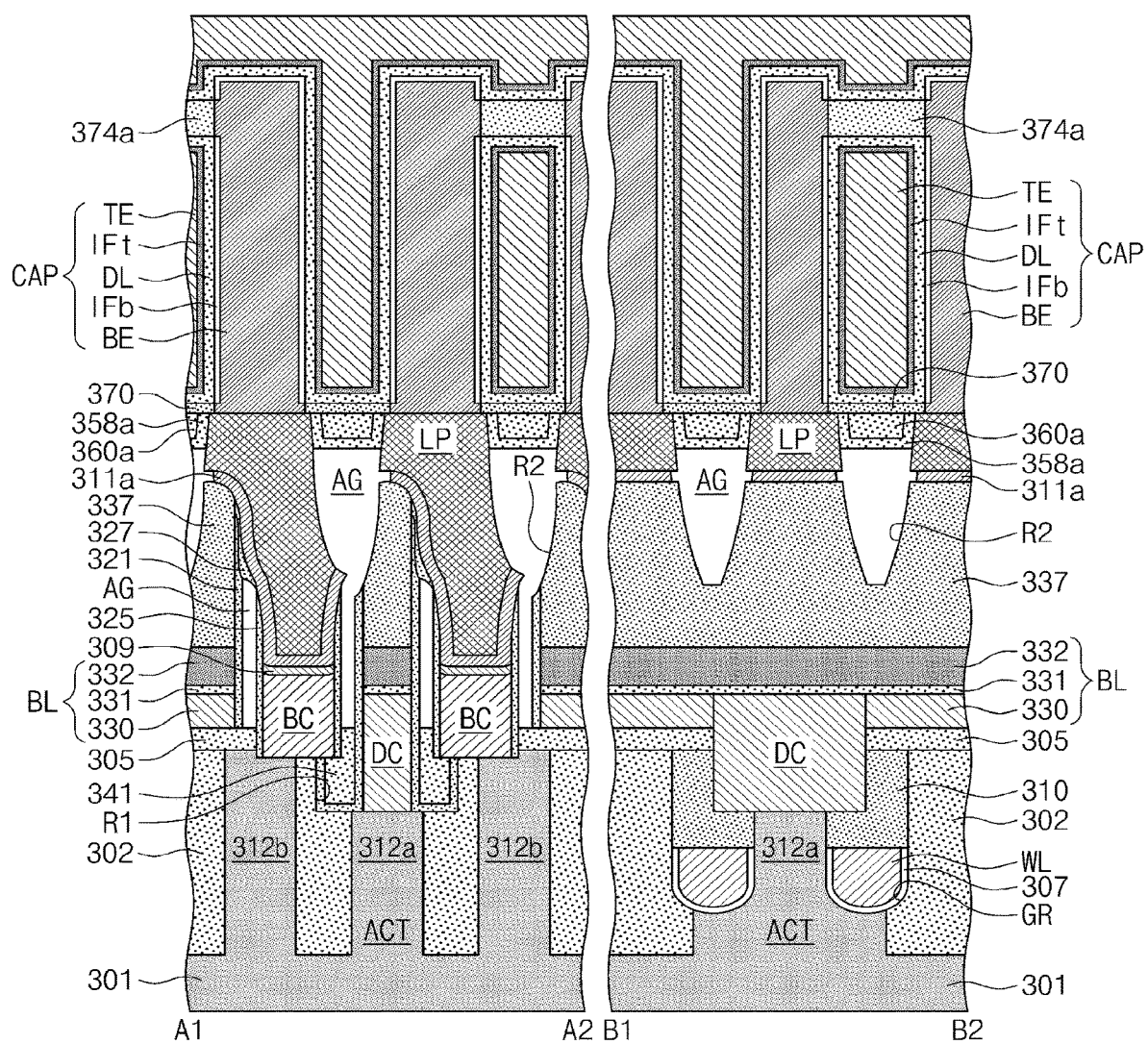
FIG. 2C illustrates a cross-sectional view along lines A1-A2 and B1-B2 of FIG. 2A.

FIG. 2A illustrates a plan view of a semiconductor memory device that includes a capacitor according to some example embodiments. FIG. 2B illustrates a cross-sectional view along lines A1-A2 and B1-B2 of FIG. 2A, according to some example embodiments. FIG. 2C illustrates a cross-sectional view along lines A1-A2 and B1-B2 of FIG. 2A, according to some other example embodiments.

Referring to FIGS. 2A and 2B, a substrate 301 may be provided therein with a device isolation pattern 302 that defines active sections ACT. The substrate 301 may be a semiconductor substrate. Each of the active sections ACT may have an isolated, e.g., island, shape. When viewed in a plan view, each of the active sections ACT may have a bar shape elongated in a third direction D3. When viewed in a plan view, the active sections ACT may correspond to portions of the substrate 301 that are surrounded by the device isolation pattern 302. The substrate 301 may include a semiconductor material. The active sections ACT may be arranged parallel to each other in the third direction D3, and one of the active sections ACT may have an end portion adjacent to a central portion of a neighboring one of the active sections ACT.

Word lines WL may run across the active sections ACT. The word lines WL may be disposed in corresponding grooves GR formed on the device isolation pattern 302 and the active sections ACT. The word lines WL may be parallel to a first direction D1 that intersects the third direction D3. The word lines WL may include a conductive material. A gate dielectric layer 307 may be disposed between the word line WL and an inner surface of groove GR. The gate dielectric layer 307 may include one or more of, e.g., thermal oxide, silicon nitride, silicon oxynitride, and high-k dielectric. Each of the word lines WL may have a curved bottom surface.

A first impurity region 312a may be disposed in a center of each active section ACT between a pair of word lines WL (right side of FIG. 2B), and a pair of second impurity regions 312b may be disposed in opposite edge portions of each active section ACT (left side of FIG. 2B). The first and second impurity regions 312a and 312b may be doped with, e.g., N-type impurities. The first impurity region 312a may correspond to a common drain region, and the second impurity regions 312b may correspond to source regions. Each word line WL and its adjacent first and second impurity regions 312a and 312b may constitute a transistor.

The word lines WL may have their top surfaces lower than those of the active sections ACT, e.g., a distance between a bottom of the substrate 301 and top surfaces of the word lines WL may be smaller than a distance between the bottom of the substrate 301 and top surfaces of the active sections ACT. A word-line capping pattern 310 may be disposed on each, e.g., top surface of the, word line WL. The word-line capping patterns 310 may have their linear shapes that extend along longitudinal directions of the word lines WL, and may cover the top surfaces of the word lines WL. The word-line capping patterns 310 may be formed of, e.g., a silicon nitride layer.

An interlayer dielectric pattern 305 may be disposed on the substrate 301. The interlayer dielectric pattern 305 may be formed of a single-layered or multi-layered structure that includes at least one of, e.g., a silicon oxide layer, a silicon nitride layer, and a silicon oxynitride layer. The interlayer dielectric pattern 305 may be formed to have island shapes that are spaced apart from each other when viewed in a plan view. The interlayer dielectric pattern 305 may simultaneously cover end portions of two adjacent active sections ACT.

Upper portions of the substrate 301, the device isolation pattern 302, and the word-line capping pattern 310 may be partially recessed to provide a first recess R1. The first recess R1 may have a net shape when viewed in a plan view. Bit lines BL may be disposed on the interlayer dielectric pattern 305. The bit lines BL may run across the word-line capping patterns 310 and the word lines WL.

As disclosed in FIG. 2A, the bit lines BL may extend in a second direction D2 that intersects the first and third directions D1 and D3. Each of the bit lines BL may include a polysilicon pattern 330, an ohmic pattern 331, and a metal-containing pattern 332 that are sequentially stacked.

The polysilicon pattern 330 may include, e.g., impurity-doped polysilicon or impurity-undoped polysilicon. The ohmic pattern 331 may include metal silicide. The metal-containing pattern 332 may include one or more of metal (e.g., tungsten, titanium, or tantalum) and conductive metal nitride (e.g., titanium nitride, tantalum nitride, or tungsten nitride). Bit-line capping patterns 337 may be disposed on corresponding bit lines BL. The bit-line capping patterns 337 may include a dielectric material, e.g., silicon nitride.

A bit-line contact DC may be disposed in the first recess R1 that intersects the bit line BL. The bit-line contact DC may include, e.g., impurity-doped polysilicon or impurity-undoped polysilicon. The bit-line contact DC may be electrically coupled to the first impurity region 312a, and may electrically connect the first impurity region 312a to the bit line BL.

A buried dielectric pattern 341 may be disposed in a portion of the first recess R1, which portion is not occupied by the bit-line contact DC. The buried dielectric pattern 341 may have a single-layered or multi-layered structure that includes one or more of, e.g., a silicon oxide layer, a silicon nitride layer, and a silicon oxynitride layer.

As shown in FIG. 2A, storage node contacts BC may be disposed between a pair of adjacent bit lines BL. The plurality of storage node contacts BC may be spaced apart from each other. The storage node contacts BC may include, e.g., impurity-doped polysilicon or impurity-undoped polysilicon. The storage node contacts BC may have their concave top surfaces.

The bit line BL and the storage node contact BC may have therebetween a bit-line spacer including a first spacer 321 and a second spacer 325 that are spaced apart from each other across an air gap AG. The first spacer 321 may cover a sidewall of the bit line BL and a sidewall of the bit-line capping pattern 337. The second spacer 325 may be adjacent to the storage node contact BC. The first spacer 321 and the second spacer 325 may include the same material. For example, the first and second spacers 321 and 325 may include silicon nitride.

The second spacer 325 may have a bottom surface lower than that of the first spacer 321, e.g., a distance between the bottom surface of the substrate 301 and a bottom surface of the second spacer 325 may be smaller than a distance between the bottom of the substrate 301 and a bottom surface of the first spacer 321. The second spacer 325 may have a top end whose level is lower than that of a top end of the first spacer 321, e.g., a distance between the bottom surface of the substrate 301 and a top surface of the second spacer 325 may be smaller than a distance between the bottom of the substrate 301 and a top surface of the first spacer 321. Therefore, it may be possible to increase a margin for forming a landing pad LP which will be discussed below and then to prevent disconnection between the landing pad LP and the storage node contact BC. The first spacer 321 may extend to cover a sidewall of the bit-line contact DC and a sidewall and a bottom surface of the first recess R1.

A storage node ohmic layer 309 may be disposed on the storage node contact BC. The storage node ohmic layer 309 may include, e.g., metal silicide. The storage node ohmic layer 309, the first and second spacers 321 and 325, and the bit-line capping pattern 337 may be covered with a diffusion break pattern 311a. The diffusion break pattern 311a may include metal nitride, e.g., titanium nitride or tantalum nitride. A landing pad LP may be disposed on the diffusion break pattern 311a. The landing pad LP may include a material containing metal, e.g., tungsten. The landing pad LP may have an upper portion that covers a top surface of the bit-line capping pattern 337 and has a width greater than that of the storage node contact BC (e.g., in top view in FIG. 2A).

As shown in FIG. 2A, a center of the landing pad LP may shift in the first direction D1 from a center of the storage node contact BC. A portion of the bit line BL may vertically overlap the landing pad LP. One upper sidewall of the bit-line capping pattern 337 may overlap the landing pad LP and may be covered with a third spacer 327. A second recess R2 may be formed on other upper sidewall of the bit-line capping pattern 337, e.g., the bit-line capping pattern 337 may be between the second recess R2 and the bit-line capping pattern 337 in the first direction D1 (left side of FIG. 2A).

A first capping pattern 358a may be provided between neighboring landing pads LP. The first capping pattern 358a may have a liner shape, and may have an interior filled with a second capping pattern 360a. The first and second capping patterns 358a and 360a may independently include, e.g., a silicon nitride layer, a silicon oxide layer, a silicon oxynitride layer, or a porous layer. The first capping pattern 358a may have its porosity greater than that of the second capping pattern 360a.

The air gap AG between the first and second spacers 321 and 325 may extend into a space between the landing pads LP. The air gap AG may expose a bottom surface of the first capping pattern 358a. The air gap AG may extend toward the diffusion break pattern 311a. For example, the diffusion break pattern 311a may be recessed between the landing pad LP and the bit-line capping pattern 337.

Bottom electrodes BE may be disposed on corresponding landing pads LP. The bottom electrode BE may include one or more of a metal nitride layer, e.g., an impurity-doped polysilicon layer or a titanium nitride layer, and a metal layer, e.g., a tungsten layer, an aluminum layer, or a copper layer. The bottom electrode BE may have a circular columnar shape, a hollow cylindrical shape, or a cup shape. A support pattern 374a may be provided between neighboring bottom electrodes BE, supporting the bottom electrodes BE. The support pattern 374a may include a dielectric material, e.g., silicon nitride, silicon oxide, or silicon oxynitride.

Between the bottom electrodes BE, the first and second capping patterns 358a and 360a may be covered with an etch stop layer 370. The etch stop layer 370 may include a dielectric material, e.g., silicon nitride, silicon oxide, or silicon oxynitride. A dielectric layer DL may cover a surface of each of the bottom electrode BE, the support pattern 374a, and the etch stop layer 370. The dielectric layer DL may be covered with a top electrode TE. An interface layer IFt may be provided between the dielectric layer DL and the top electrode TE. The top electrode TE may include one or more of, e.g., an impurity-doped polysilicon layer, an impurity-doped silicon-germanium layer, a metal nitride layer such as a titanium nitride layer, and a metal layer including tungsten, aluminum, or copper. A capacitor CAP may be constituted by the bottom electrode BE, the dielectric layer DL, the interface layer IFt, and the top electrode TE. Accordingly, there may be provided a semiconductor memory device 1000 including the capacitor CAP.

The bottom electrode BE, the dielectric layer DL, the interface layer IFt, and the top electrode TE of the capacitor CAP may respectively correspond to the bottom electrode 10, the dielectric layer 30, the interface layer 40, and the top electrode 50 of FIG. 1A. The explanation of the interface layer 40 discussed with reference to FIGS. 1A to 1C is applicable identically or similarly to the interface layer IFt in FIG. 2B. For example, the interface layer IFt may include a metal oxide (e.g., TiOx), and further include an additional metallic constituent (e.g., aluminum (Al)) or a semiconductor constituent (e.g., silicon (Si)). The additional constituent may have an amount of about 5 at % or less of a total amount of the interface layer IFt. The interface layer IFt may have a bulk structure in which the additional constituent has a uniform or non-uniform concentration. Alternatively, the interface layer IFt may have a laminated structure with a stacked structure of a plurality of layers having the same constituent or different constituents.

In another example, as shown in FIG. 2C, an interface layer IFb may further be provided between the bottom electrode BE and the dielectric layer DL. The interface layer IFb may correspond to the interface layer 20 of FIG. 1D. The description of the interface layer 20 in FIG. 1D is applicable identically or similarly to the interface layer IFb.

Figure 3A:
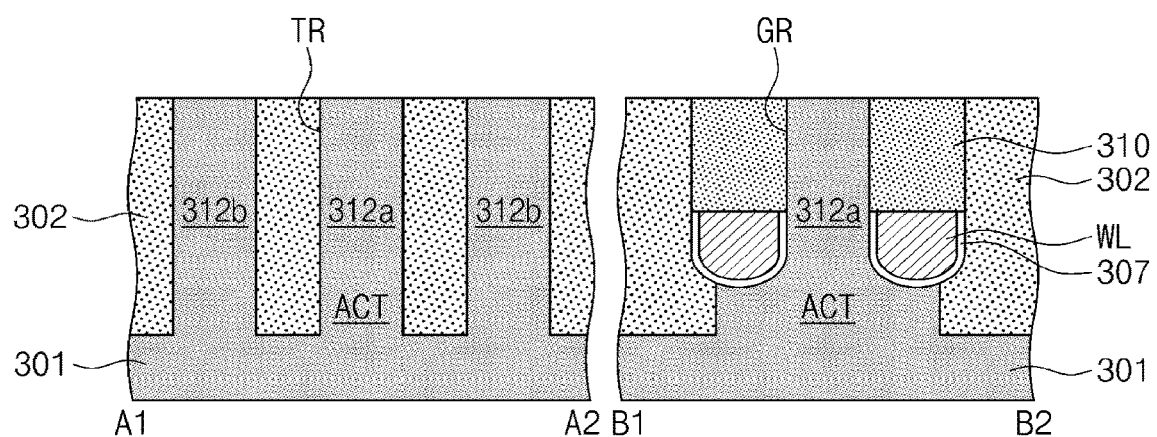
FIGS. 3A to 3R illustrate cross-sectional views along lines A1-A2 and B1-B2 of FIG. 2A, showing stages in a method of fabricating a semiconductor memory device including a capacitor according to some example embodiments.
Figure 3B:
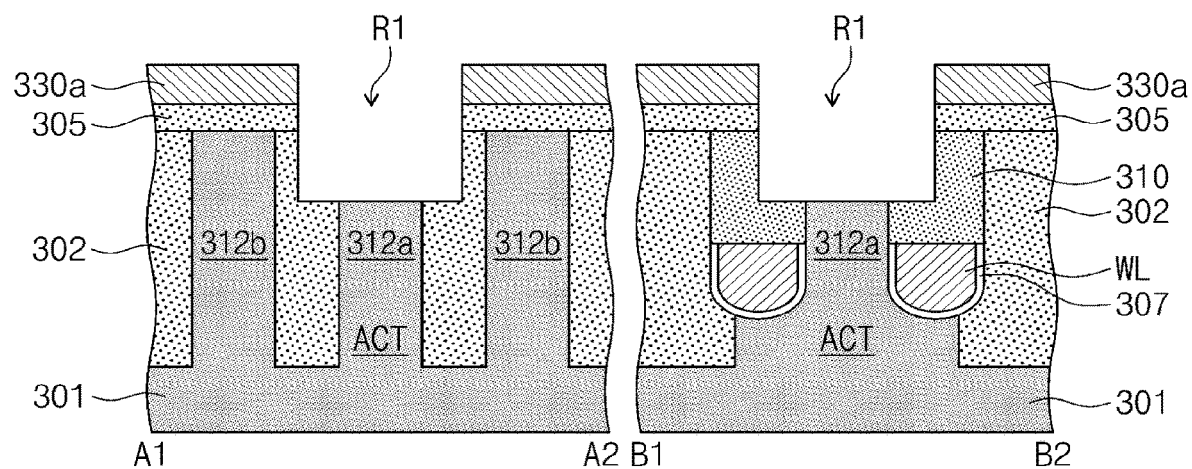
Figure 3C:
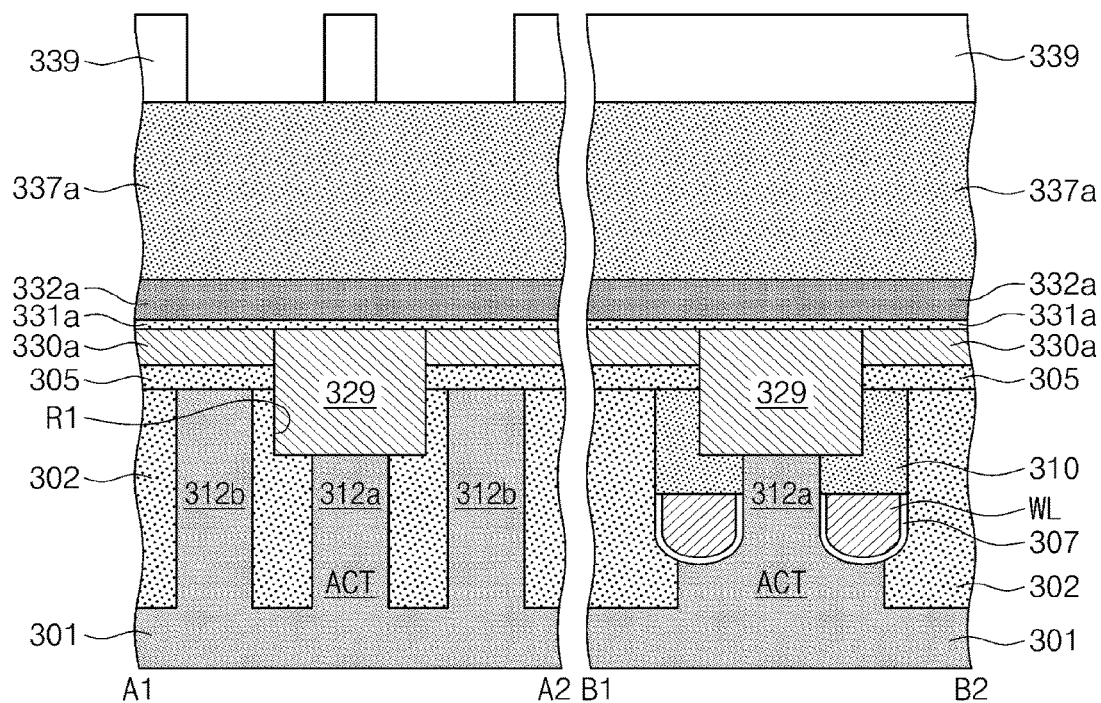
Figure 3D:
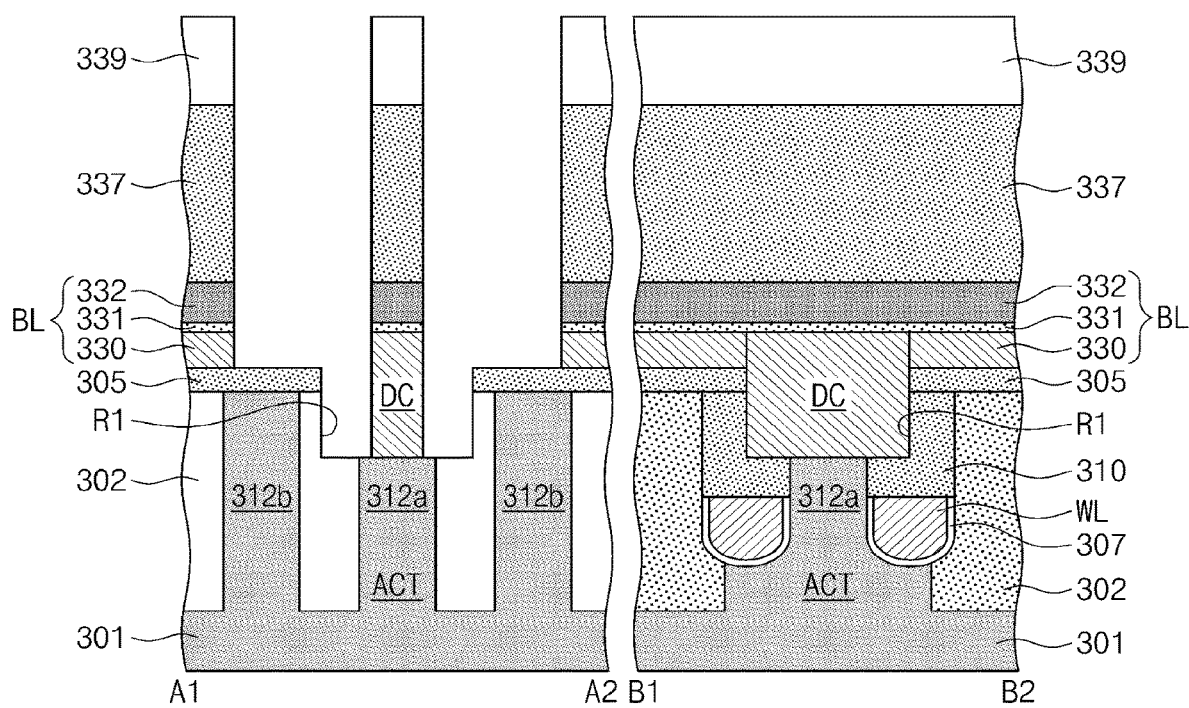
Figure 3E:
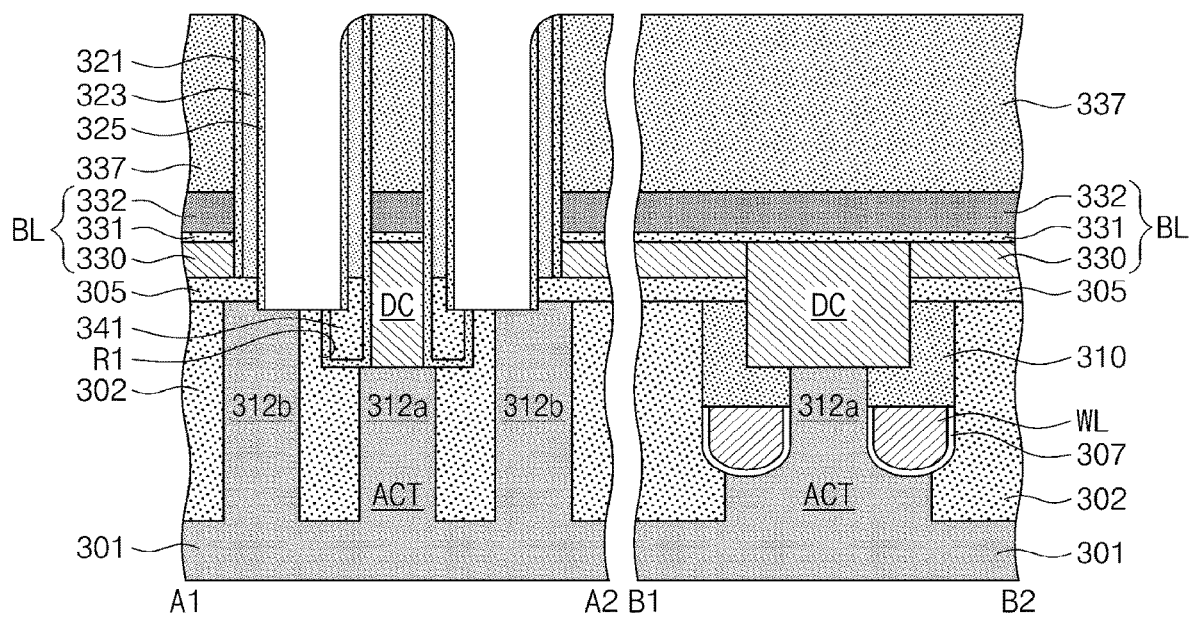
Figure 3F:
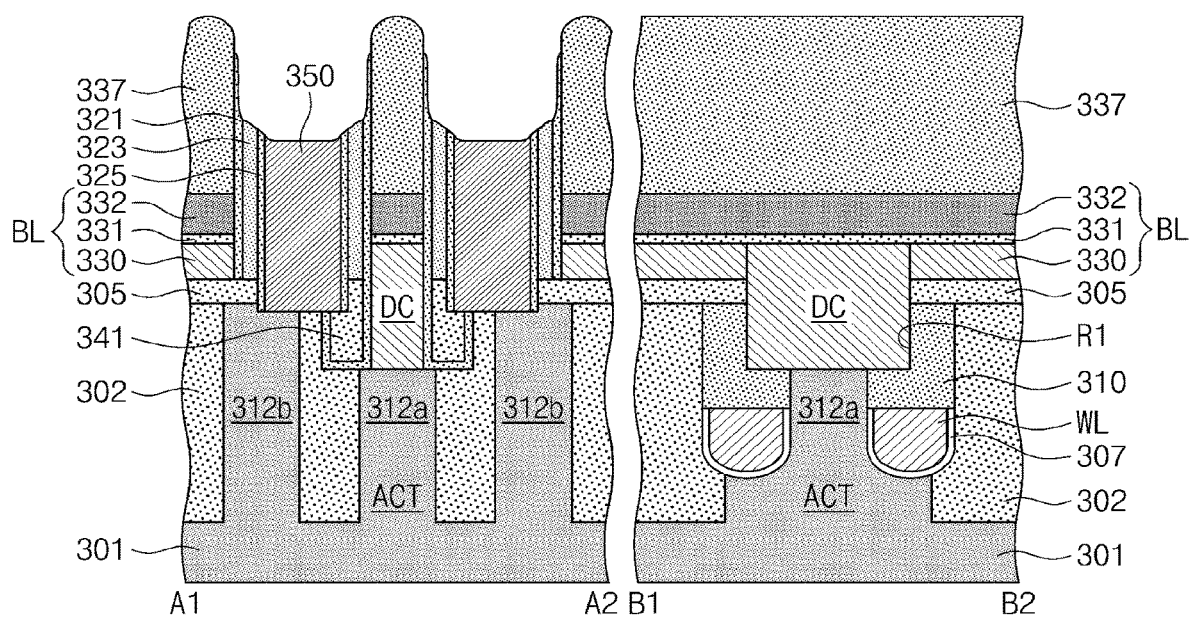
Figure 3G:
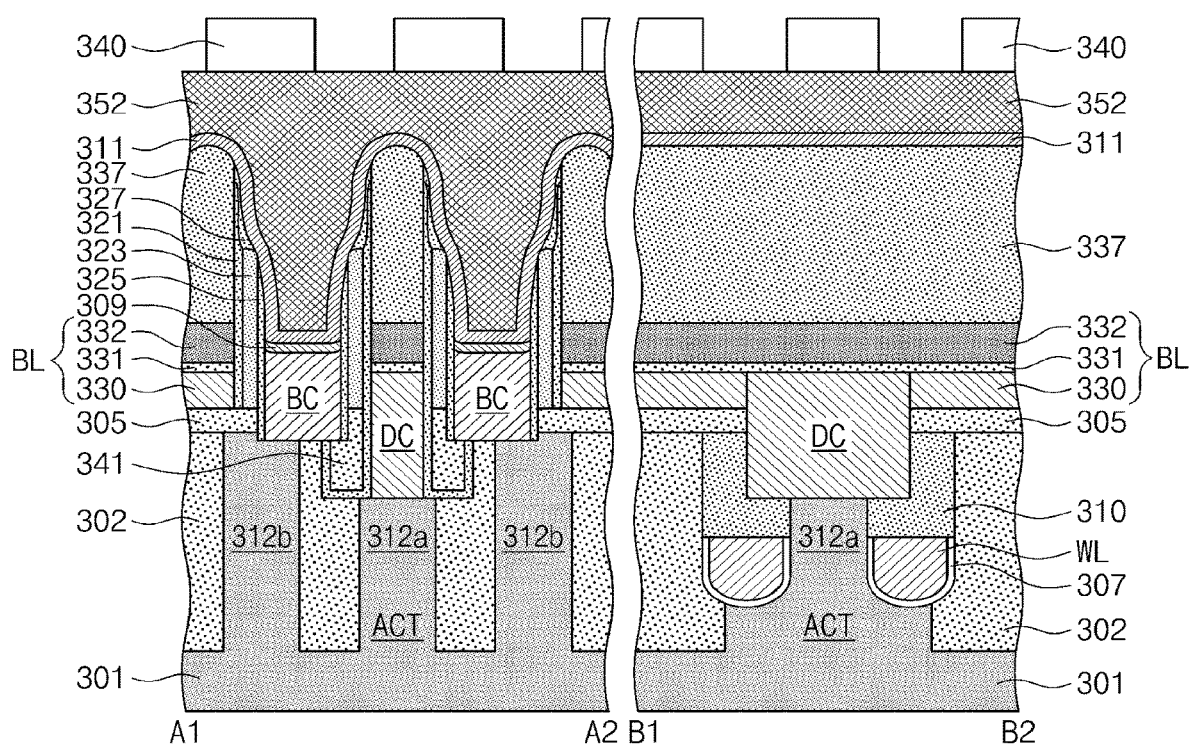
Figure 3H:
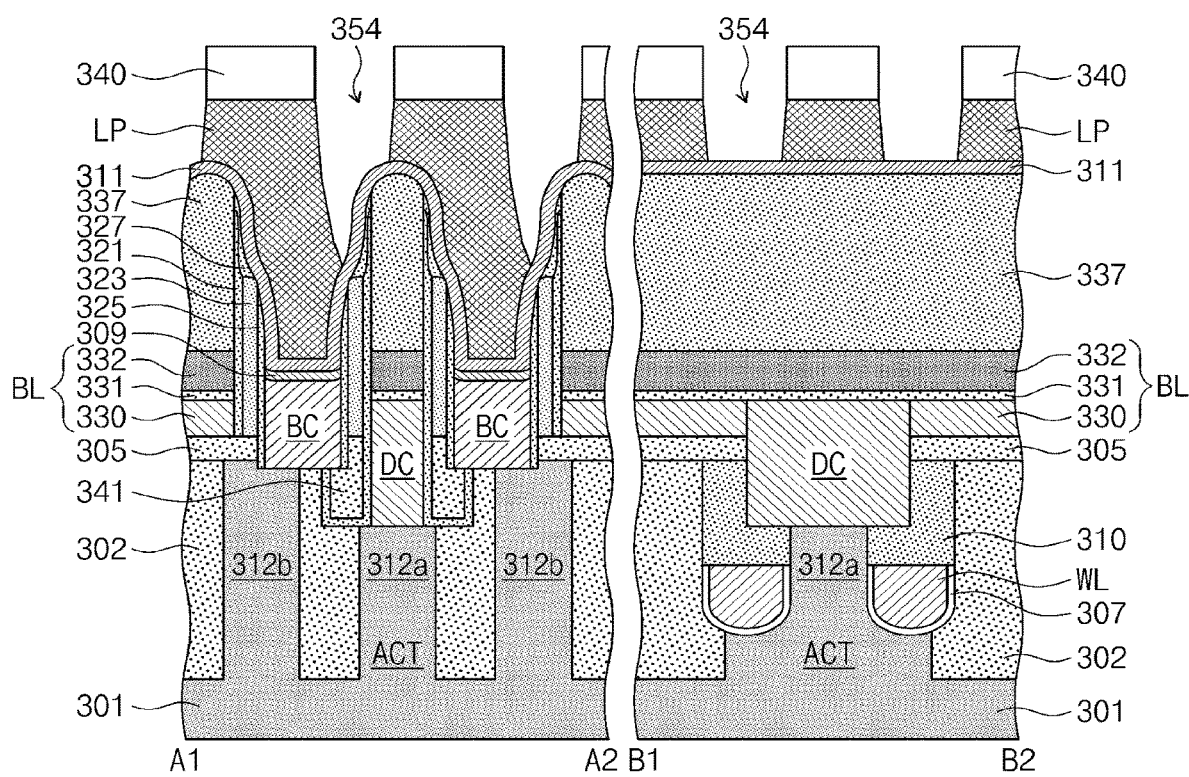
Figure 3I:
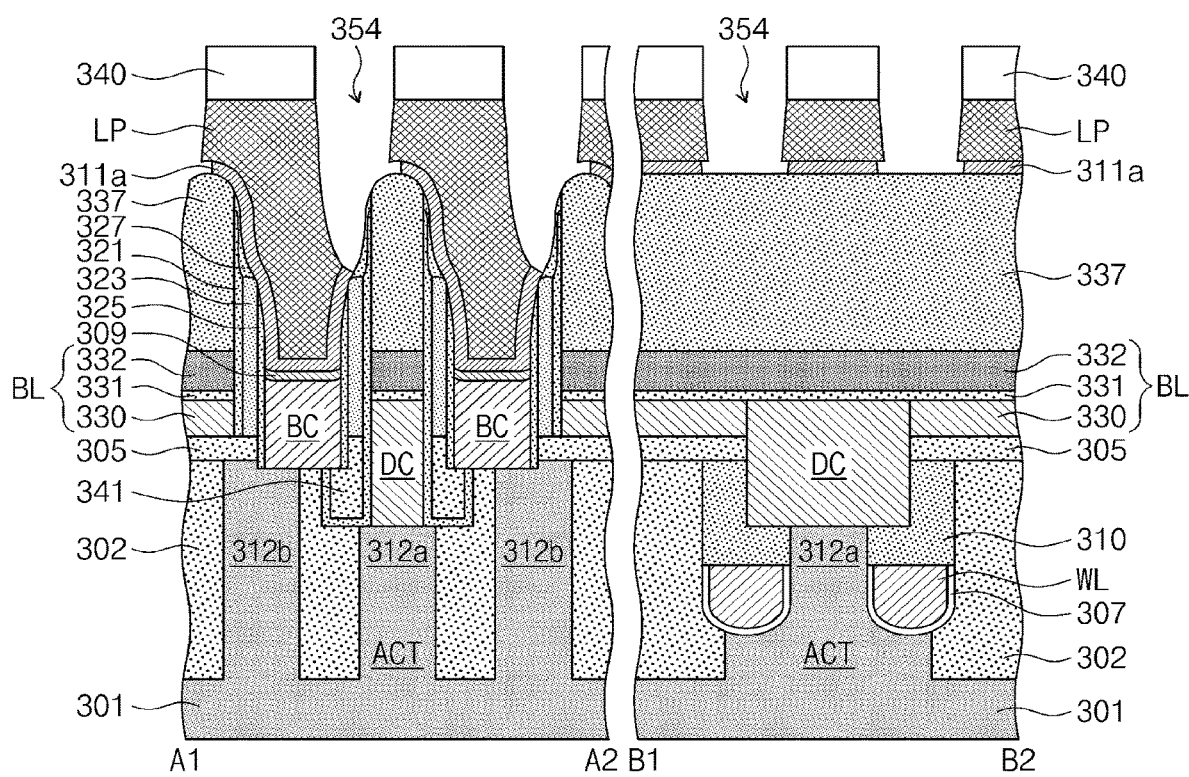
Figure 3J:
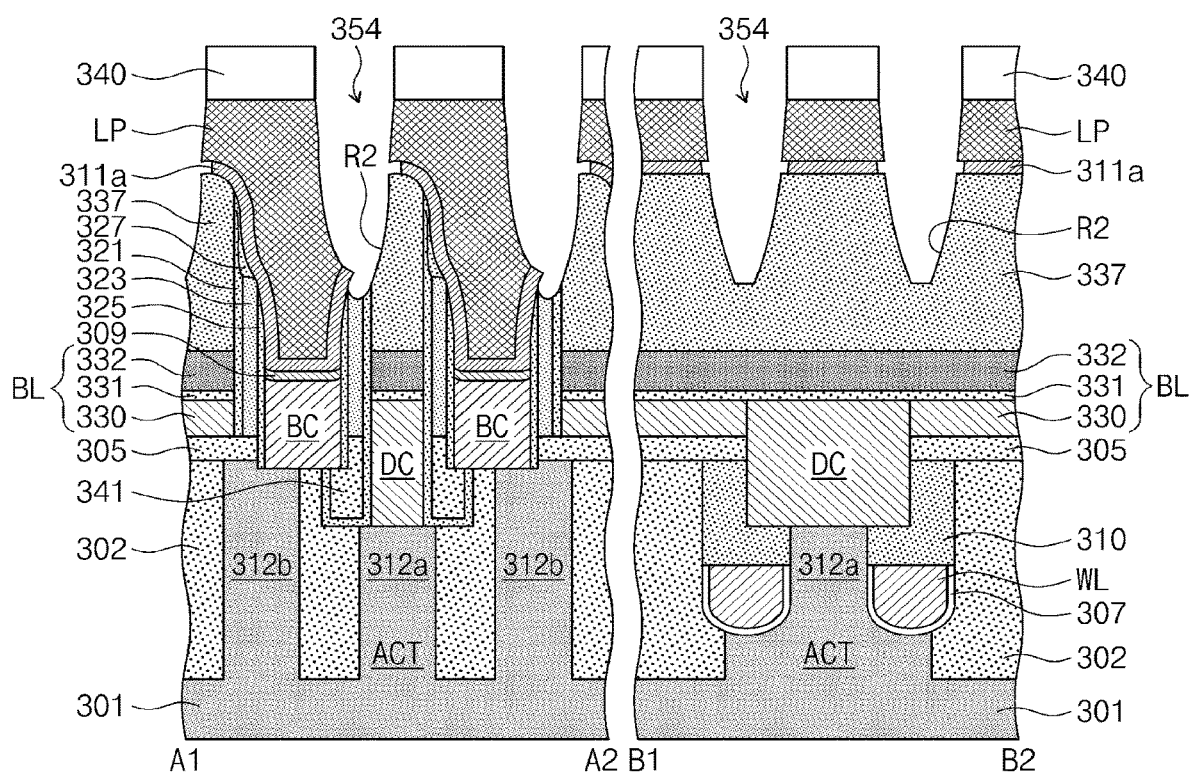
Figure 3K:
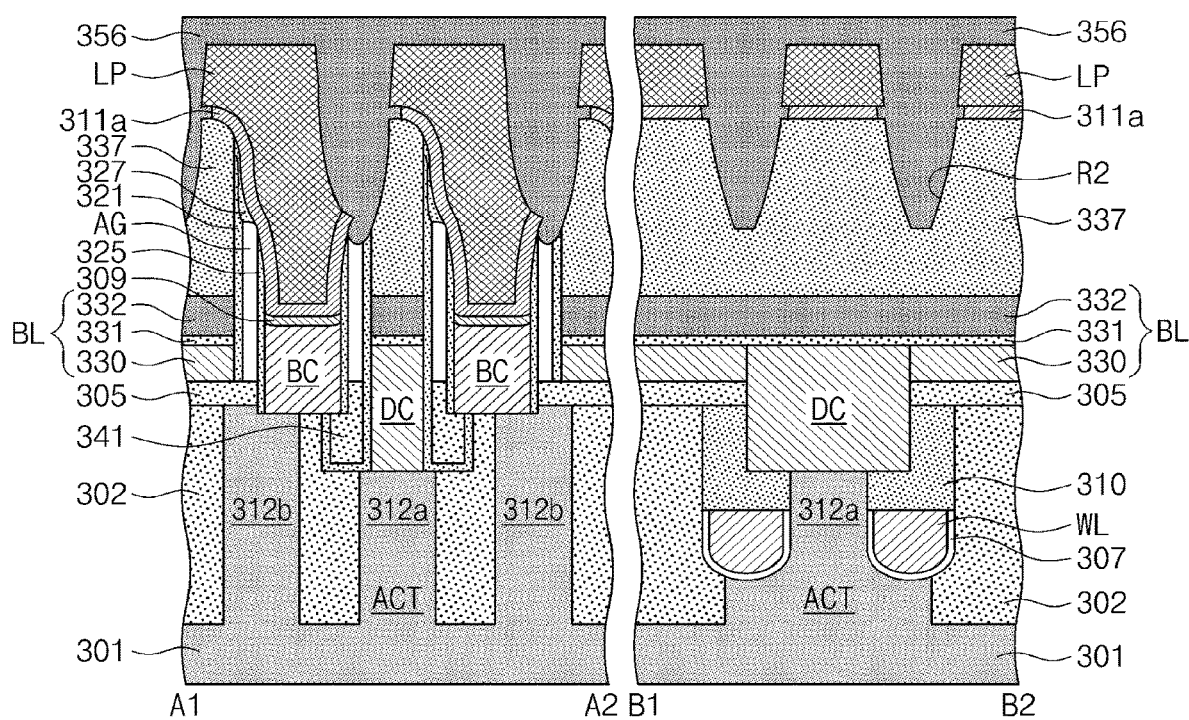
Figure 3L:
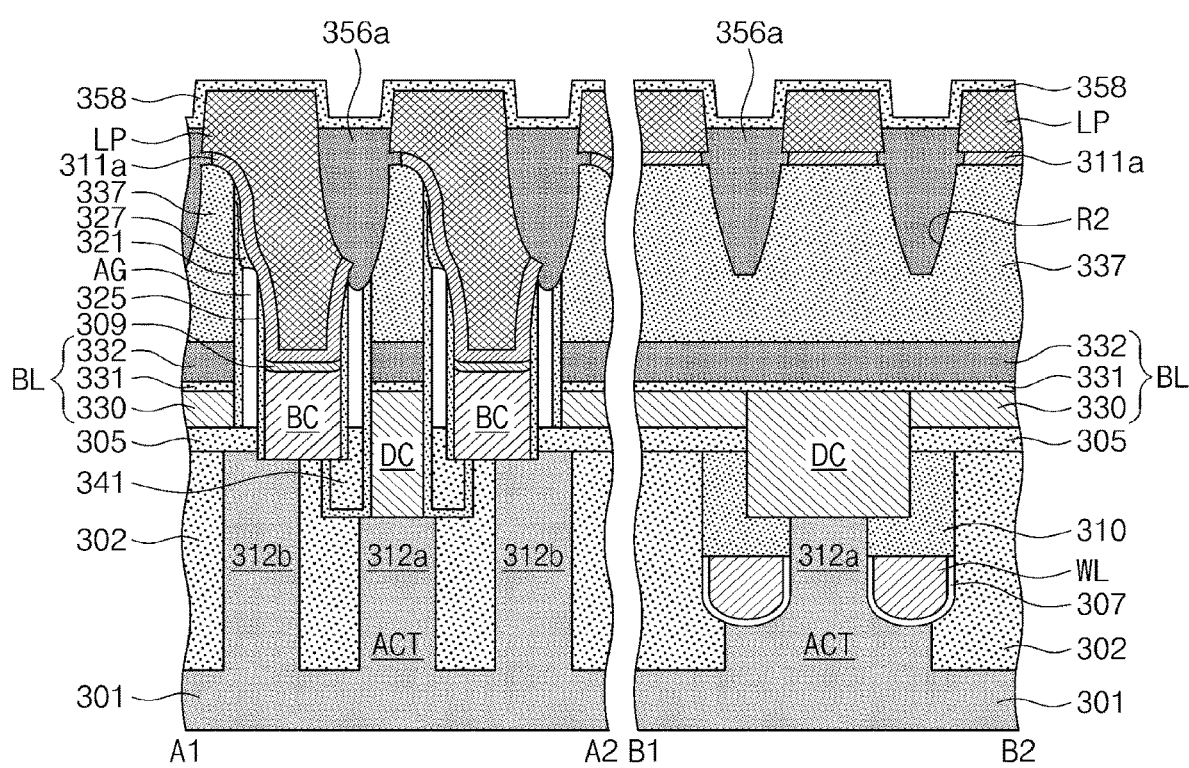
Figure 3M:
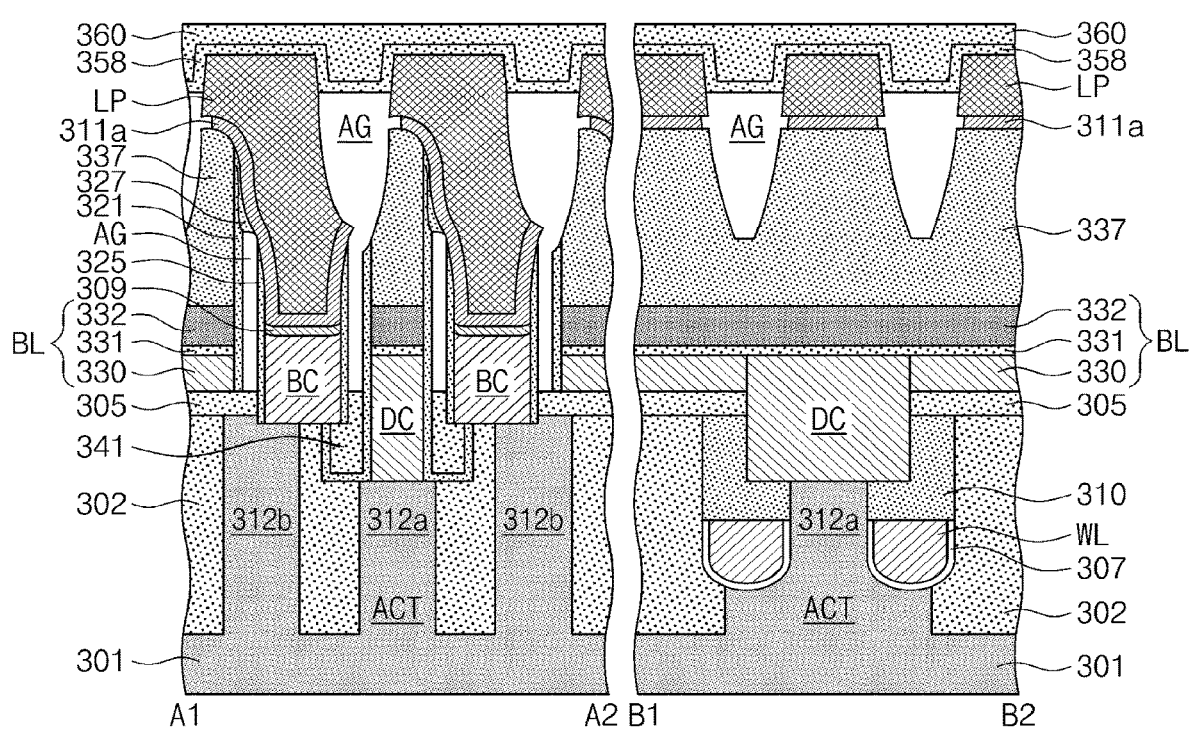
Figure 3N:
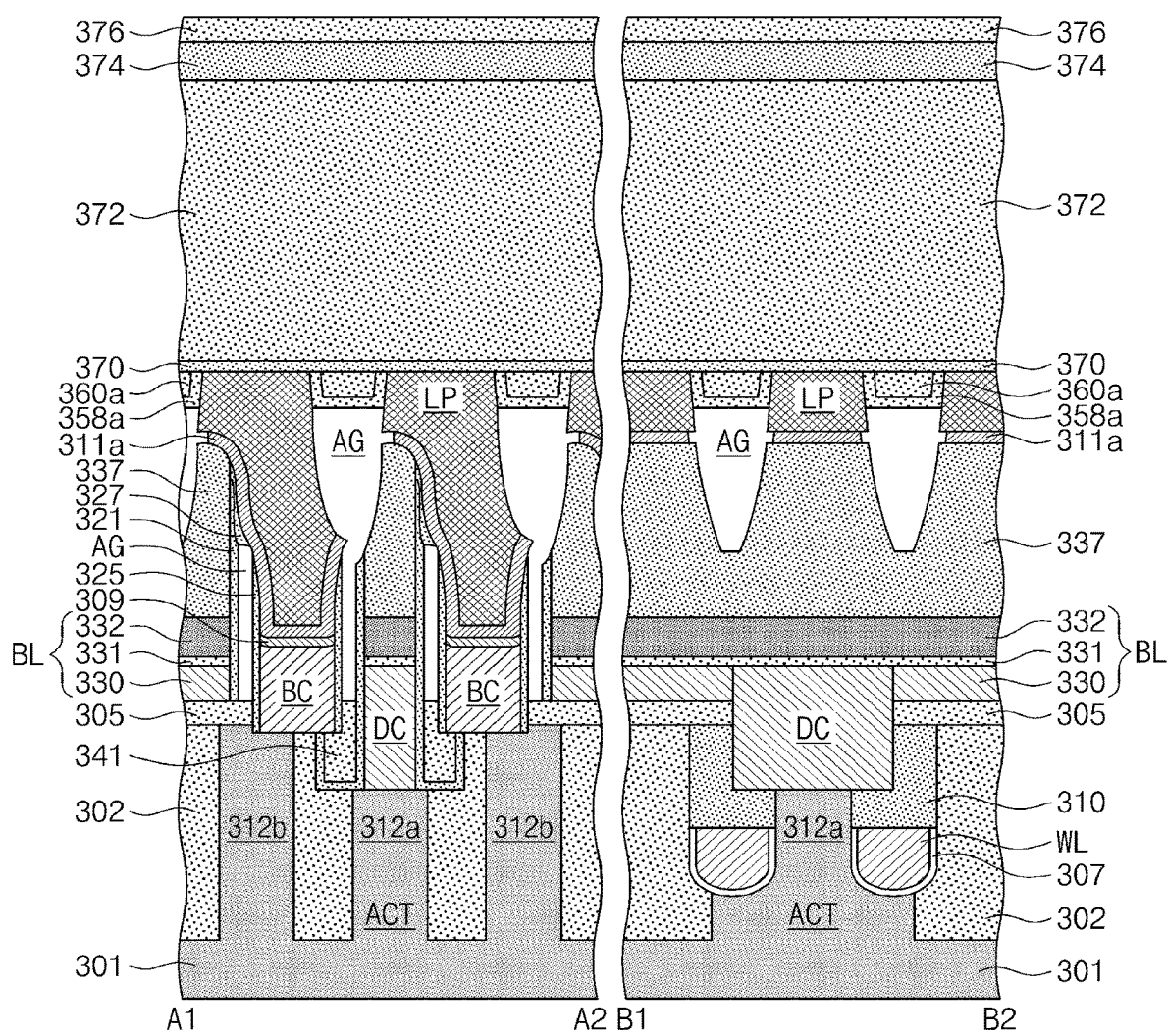
Figure 30:
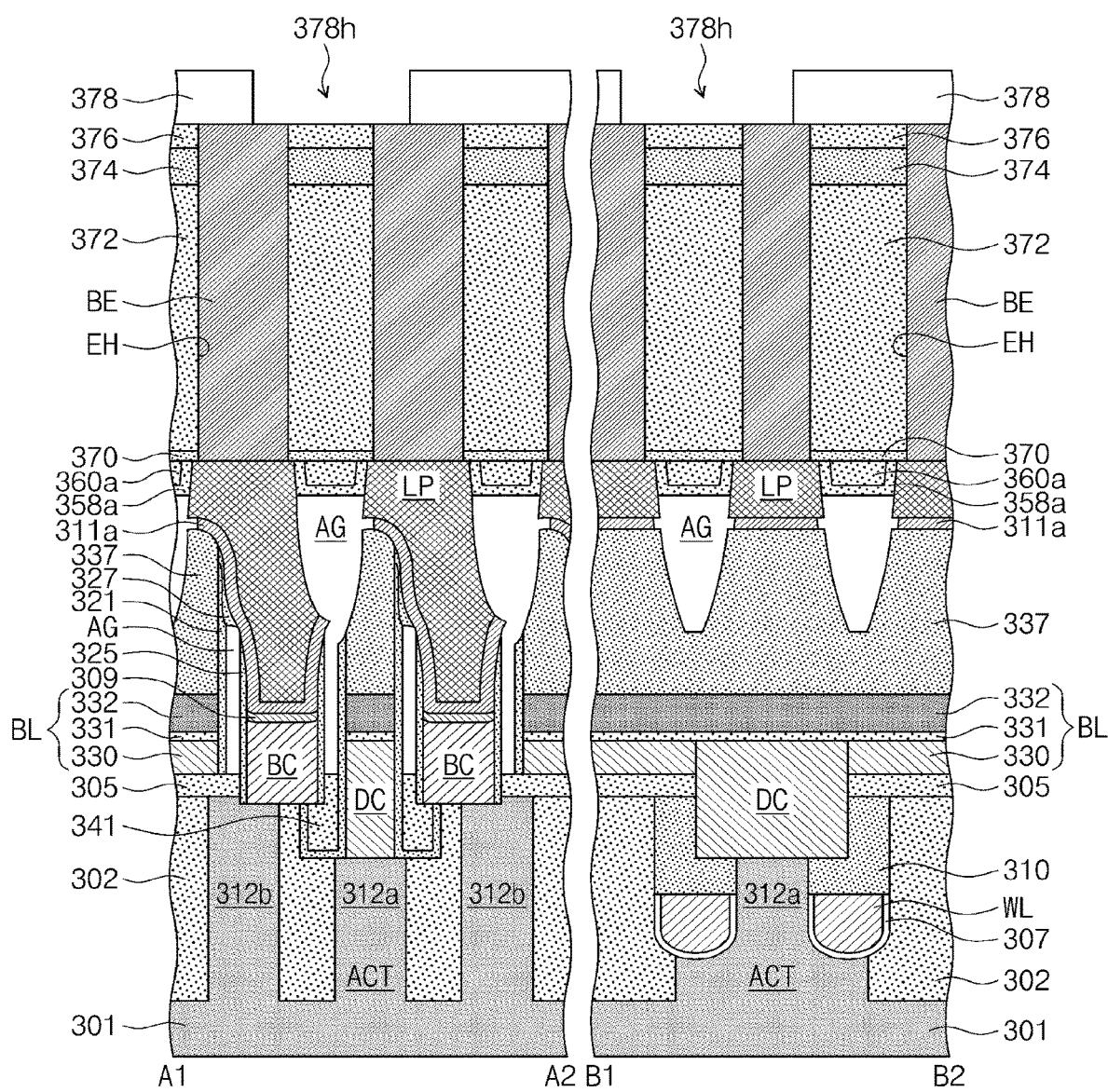
Figure 3P:
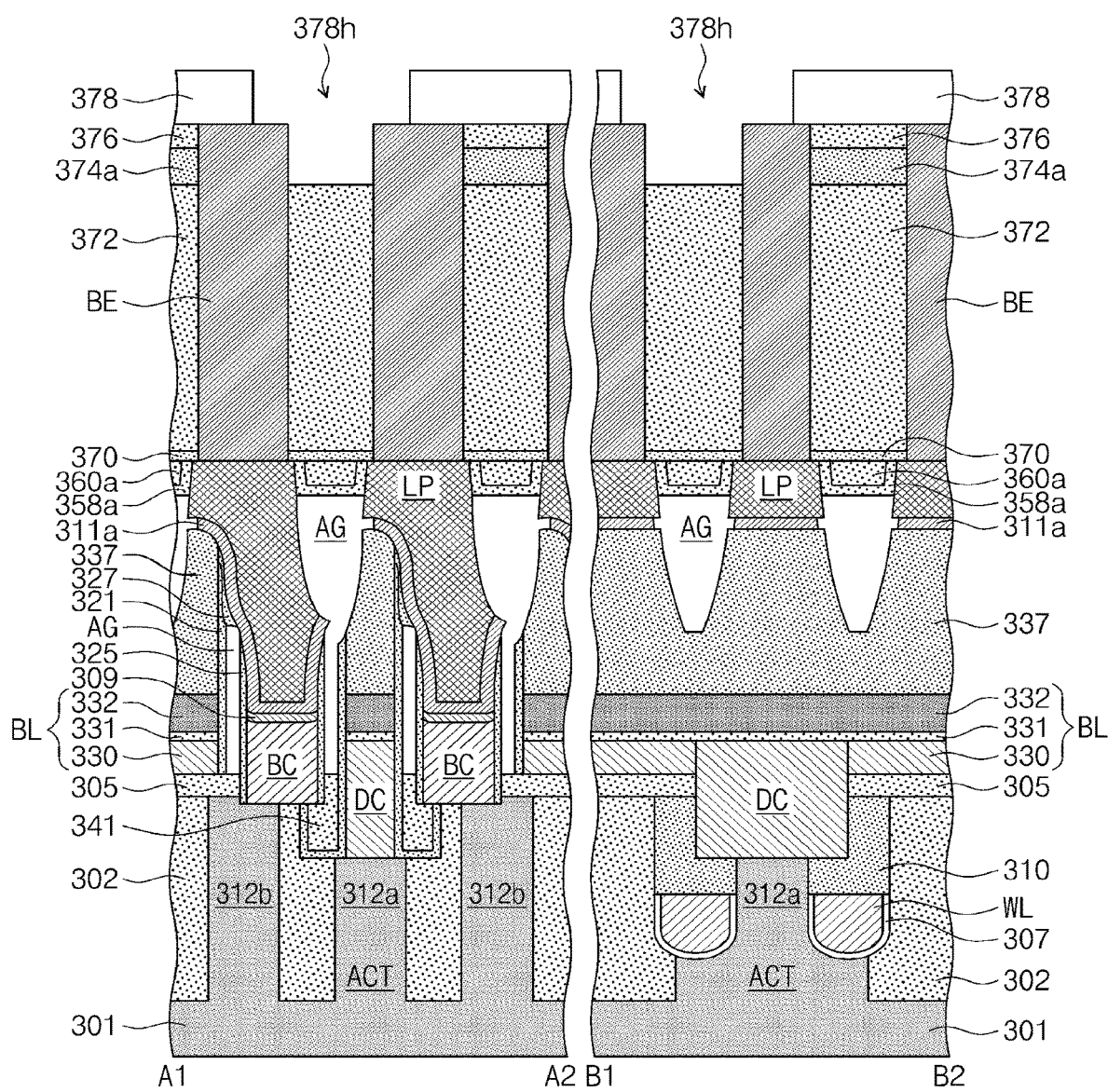
Figure 3Q:
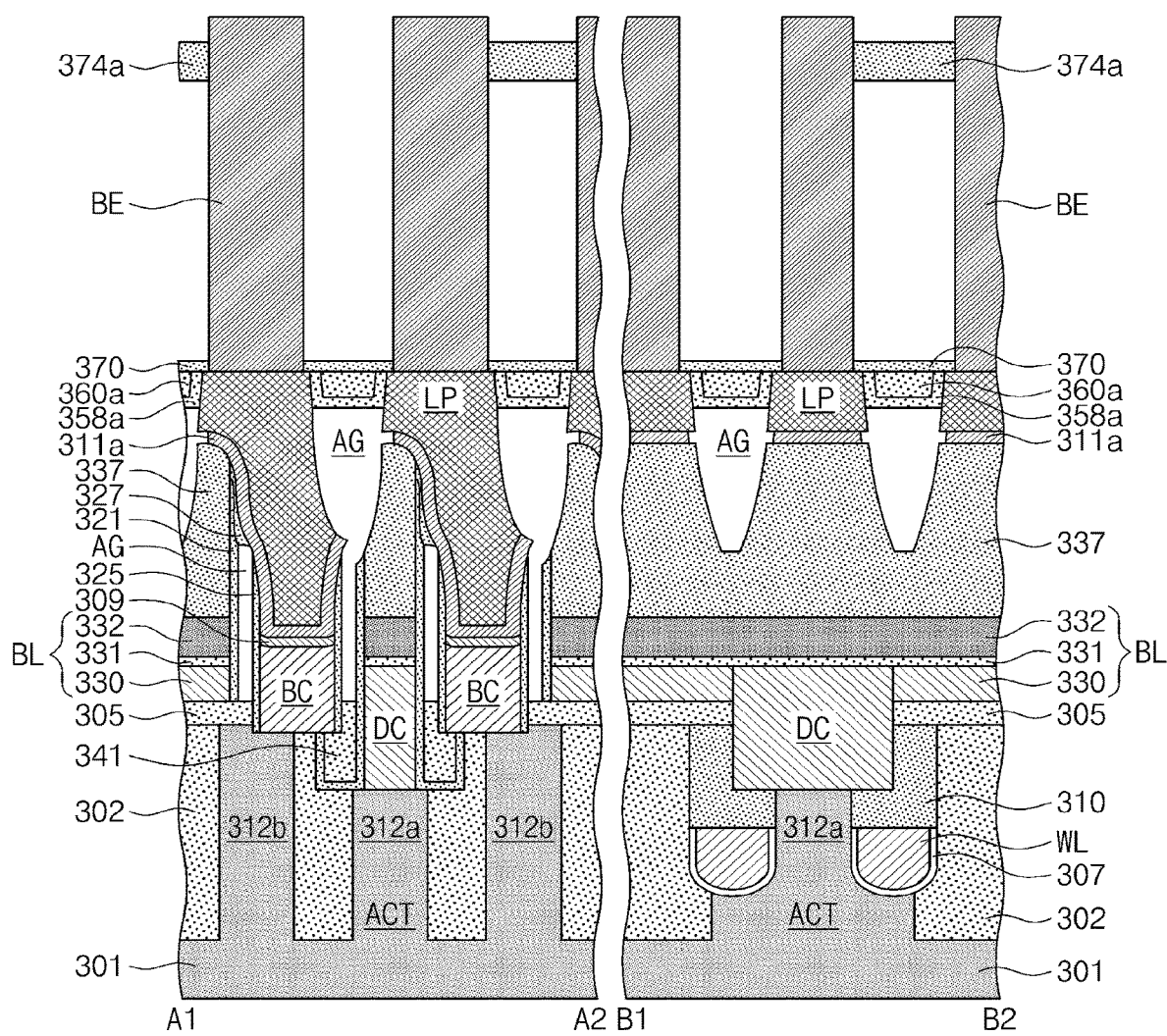
Figure 3R:
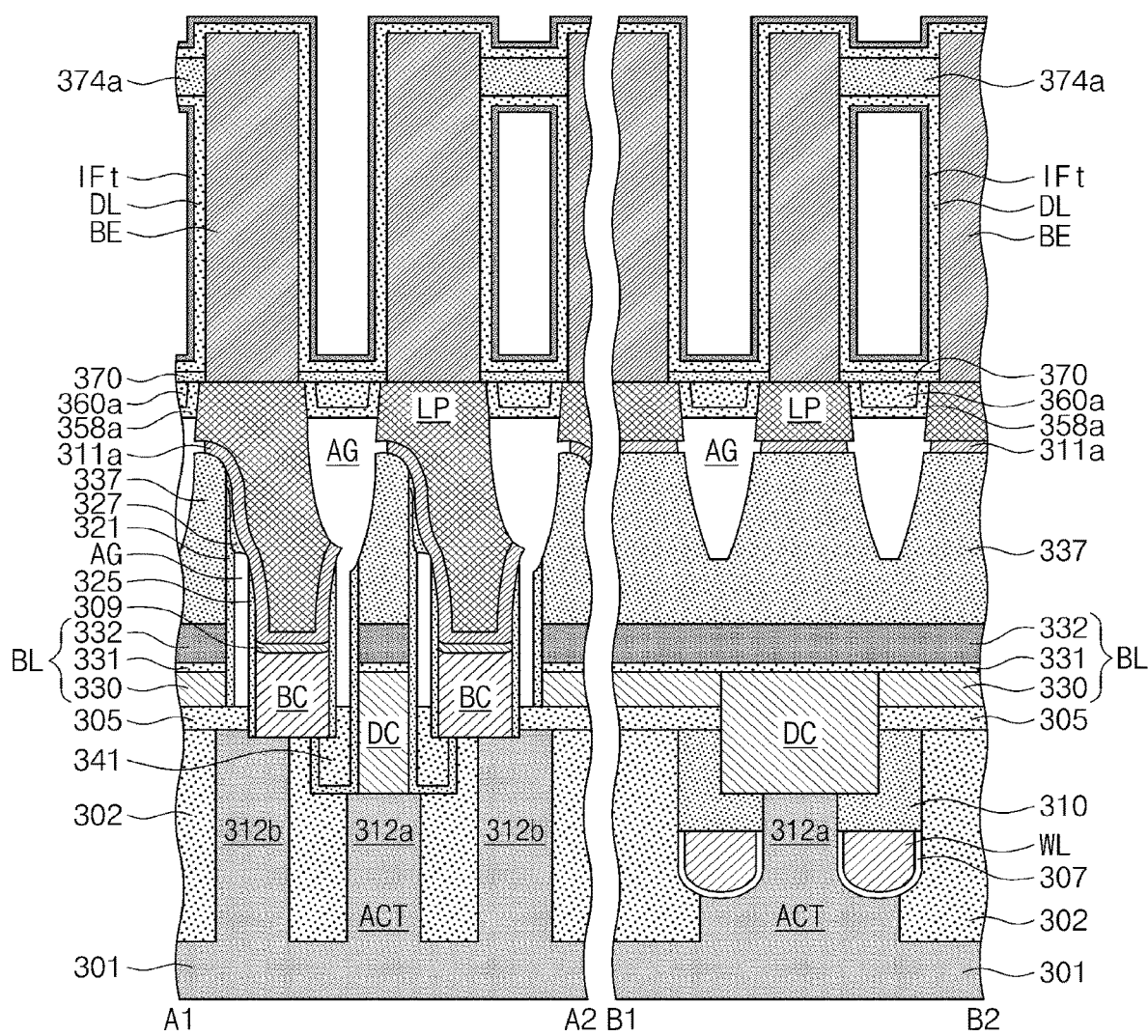

FIGS. 3A to 3R illustrate cross-sectional views along lines A1-A2 and B1-B2 of FIG. 2A, showing stages in a method of fabricating a semiconductor memory device that includes a capacitor according to some example embodiments.

Referring to FIG. 3A, the device isolation pattern 302 may be formed in the substrate 301, thereby defining the active sections ACT. For example, a trench TR may be formed in the substrate 301, and the trench TR may be filled with a dielectric material to form the device isolation pattern 302. The active sections ACT and the device isolation pattern 302 may be etched to form grooves GR. Each of the grooves GR may have a curved bottom surface. The substrate 301 may be a semiconductor substrate, e.g., a silicon wafer.

Word lines WL may be formed in corresponding grooves GR. A pair of word lines WL may run across the active sections ACT. Before the word lines WL are formed, the gate dielectric layer 307 may be formed on an inner surface of each of the grooves GR. The gate dielectric layer 307 may be formed by a thermal oxidation process, a chemical vapor deposition process, and/or an atomic layer deposition process. The grooves GR may be filled with a conductive layer deposited on the substrate 301, and then an etch-back process or a chemical mechanical polishing process may be performed to form the word lines WL in the grooves GR. The word lines WL may be recessed to have their top surfaces lower than those of the active sections ACT. The grooves GR may be filled with a dielectric layer, e.g., a silicon nitride layer, formed on the substrate 301, and then the dielectric layer may be planarized to form word-line capping patterns 310 on corresponding word lines WL.

The word-line capping patterns 310 and the device isolation pattern 302 may be used as a mask to implant impurities into the active sections ACT. Therefore, the first and second impurity regions 312a and 312b may be formed in the active sections ACT. The first and second impurity regions 312a and 312b may have their conductivity types different from that of the substrate 301. For example, when the substrate 301 has P-type conductivity, each of the first and second impurity regions 312a and 312b may have N-type conductivity.

Referring to FIG. 3B, the interlayer dielectric pattern 305 and a polysilicon mask pattern 330a may be formed on the substrate 301. For example, a dielectric layer and a first polysilicon layer may be sequentially formed on the substrate 301. The first polysilicon layer may be patterned to form the polysilicon mask pattern 330a. The polysilicon mask pattern 330a may be used as an etching mask to etch the dielectric layer, the device isolation pattern 302, the substrate 301, and the word-line capping patterns 310 to form the first recess R1 and the interlayer dielectric pattern 305. The interlayer dielectric pattern 305 may have a plurality of island shapes that are spaced apart from each other. A plurality of first recesses R1 may have a net shape, e.g., matrix pattern, when viewed in a plan view. The first recesses R1 may expose the first impurity regions 312a.

Referring to FIG. 3C, a second polysilicon layer 329 may be formed on the substrate 301, thereby filling the first recess R1. And then, the second polysilicon layer 329 may undergo a planarization process to remove the second polysilicon layer 329 on the polysilicon mask pattern 330a and to expose the polysilicon mask pattern 330a.

An ohmic layer 331a, a metal-containing layer 332a, and a capping layer 337a may be sequentially formed on the polysilicon mask pattern 330a and the second polysilicon layer 329. The ohmic layer 331a may be formed of metal silicide, e.g., cobalt silicide. A metal layer may be deposited on the polysilicon mask pattern 330a and the second polysilicon layer 329, and then an annealing process may be performed to form the ohmic layer 331a. The annealing process may cause the metal layer to react with the polysilicon mask pattern 330a and the second polysilicon layer 329, thereby forming the metal silicide. A non-reacted metal layer may be removed.

First mask patterns 339 may be formed on the capping layer 337a, defining a planar shape of a bit line BL which will be discussed below. The first mask patterns 339 may extend in the second direction D2 illustrated in FIG. 2A.

Referring to FIG. 3D, an etching process may be performed in which the first mask patterns 339 are used as an etching mask to sequentially etch the capping layer 337a, the metal-containing layer 332a, the ohmic layer 331a, the polysilicon mask pattern 330a, and the second polysilicon layer 329 to form the bit line BL, the bit-line contact DC, and the bit-line capping pattern 337. The bit line BL may include the polysilicon pattern 330, the ohmic pattern 331, and the metal-containing pattern 332. The etching process may partially expose a top surface of the interlayer dielectric pattern 305, and may also partially expose an inner sidewall and a bottom surface of the first recess R1. The first mask patterns 339 may be removed after the formation of the bit line BL and the bit-line contact DC.

Referring to FIG. 3E, a first spacer layer may be conformally formed on the substrate 301. The first spacer layer may conformally cover the bottom surface and the inner sidewall of the first recess R1. The first spacer layer may be, e.g., a silicon nitride layer. The first recess R1 may be filled with a dielectric layer, e.g., a silicon nitride layer, formed on the substrate 301, and then the dielectric layer may be anisotropically etched to leave the buried dielectric pattern 341 in the first recess R1. When the anisotropic etching process is performed, the first spacer layer may also be etched to form the first spacer 321.

A sacrificial spacer layer may be conformally formed on the substrate 301, and then an anisotropic etching process may be performed to form a sacrificial spacer 323 that covers a sidewall of the first spacer 321. The sacrificial spacer 323 may include a material having an etch selectivity with respect to the first spacer 321. The sacrificial spacer 323 may be formed of, e.g., a silicon oxide layer.

The second spacer 325 may be formed to cover a sidewall of the sacrificial spacer 323. The second spacer 325 may be formed of, e.g., a silicon nitride layer. The second impurity region 312b may be exposed after the formation of the sacrificial spacer 323 or of the second spacer 325.

Referring to FIG. 3F, a space between a plurality of bit lines BL may be filled with a polysilicon layer formed on the substrate 301, and then the polysilicon layer may be etched to form a preliminary storage node contact 350 and to expose upper portions of the first spacer 321, the sacrificial spacer 323, and the second spacer 325. The upper portions of the sacrificial spacer 323 and the second spacer 325 may be removed to have top surfaces of the sacrificial spacer 323 and the second spacer 325 to be substantially coplanar, e.g., along a slanted plane with respect to the bottom of the substrate 301, and to have their top ends at a same level or similar to that of a top surface of the preliminary storage node contact 350. Therefore, the first spacer 321 may be exposed at the upper portion thereof.

This process may increase a process margin for forming the landing pad LP which will be discussed below. When removing the upper portions of the sacrificial spacer 323 and the second spacer 325, the upper portion of the first spacer 321 may also be partially removed to cause the first spacer 321 to have a remaining upper portion, e.g., a portion extending along a sidewall of the bit-line capping pattern 337 above the sacrificial spacer 323 and the second spacer 325, with a small width along the first direction D1.

Referring to FIG. 3G, a third spacer layer may be conformally formed on the substrate 301 and then anisotropically etched to form the third spacer 327 that covers a sidewall of the exposed upper portion of the first spacer 321. The third spacer 327 may cover an exposed top end of the sacrificial spacer 323. The preliminary storage node contact 350 may be etched to expose the upper portion of the second spacer 325 and also to form a storage node contact BC. The third spacer 327 may complement, e.g., cover in a complementary pattern, a damaged upper portion of the first spacer 321 and may cover the sacrificial spacer 323, thereby serving to prevent the bit line BL from being damaged, e.g., deteriorated, by an etchant used for etching the storage node contact BC and a cleaning solution used in a subsequent cleaning process. As a result, the bit line BL may be protected from damage.

The storage node ohmic layer 309 may be formed on the storage node contact BC, and a diffusion break layer 311 may be conformally formed on the substrate 301. A landing pad layer 352 may be formed on the substrate 301 and may fill a space between the bit-line capping patterns 337. The landing pad layer 352 may be, e.g., a tungsten layer. Second mask patterns 340 may be formed on the landing pad layer 352. The second mask patterns 340 may be formed of, e.g., an amorphous carbon layer (ACL). The second mask patterns 340 may define positions of the landing pads LP which will be discussed below. The second mask patterns 340 may be formed to vertically overlap the storage node contacts BC.

Referring to FIG. 3H, an anisotropic etching process may be performed in which the second mask patterns 340 are used as an etching mask to remove a portion of the landing pad layer 352. Therefore, the landing pads LP may be formed, and openings 354 may be formed to expose the diffusion break layer 311.

Referring to FIG. 3I, an isotropic etching process may be performed in which the diffusion break layer 311 exposed to the openings 354 is patterned to form diffusion break patterns 311a that are separated from each other and simultaneously to expose the third spacers 327 and portions of top surfaces of the bit-line capping patterns 337. Depending on the degree of progress of the isotropic etching process, the diffusion break patterns 311a may be over-etched to partially expose a bottom surface of the landing pad LP.

Referring to FIG. 3J, an anisotropic etching process may be performed to remove portions of the bit-line capping patterns 337 exposed to the openings 354 and also to remove the third spacers 327, and as a result the sacrificial spacers 323 may be exposed. In this case, the second recess R2 may be formed on the bit-line capping pattern 337. Afterwards, the second mask patterns 340 may be removed.

Referring to FIG. 3K, an isotropic etching process may be performed in which the sacrificial spacer 323 is removed to form the air gap AG between the first spacer 321 and the second spacer 325. After that, a thermal decomposition layer 356 may be formed to fill the openings 354 and the second recesses R2. The thermal decomposition layer 356 may also be formed on the landing pads LP. The thermal decomposition layer 356 may close an upper portion of the air gap AG.

Referring to FIG. 3L, a first annealing process may be performed to thermally decompose and remove an upper portion of the thermal decomposition layer 356. The partial removal of the thermal decomposition layer 356 may expose top surfaces and upper sidewalls of the landing pads LP, and may form thermal decomposition patterns 356a that are spaced apart from each other. A first capping layer 358 may be conformally formed on the thermal decomposition patterns 356a and the landing pads LP.

Referring to FIG. 3M, a second annealing process may be performed to thermally decompose the thermal decomposition patterns 356a. The thermal decomposition patterns 356a, which has been thermally decomposed, may be outgassed through the first capping layer 358. Therefore, the air gap AG may expand from a space between the first and second spacers 321 and 325 into a space between the landing pads LP. A second capping layer 360 may be formed on the first capping layer 358.

Referring to FIG. 3N, an etch-back process or a chemical mechanical polishing process may be performed in which the first capping layer 358 and the second capping layer 360 are planarized to form the first capping pattern 358a and the second capping pattern 360a that are restricted between the landing pads LP. The planarization may remove portions of the first capping layer 358 and the second capping layer 360 from the landing pads LP, and thus the landing pads LP may be exposed.

The etch stop layer 370 may be formed on the landing pads LP, the first capping pattern 358a, and the second capping pattern 360a. A first mold layer 372, a support layer 374, and a second mold layer 376 may be formed on the etch stop layer 370. The etch stop layer 370 and the support layer 374 may be formed of, e.g., a silicon nitride layer. The first mold layer 372 and the second mold layer 376 may be formed of a material having an etch selectivity with respect to the support layer 374. For example, the first mold layer 372 and the second mold layer 376 may be formed of a silicon oxide layer.

Referring to FIG. 3O, the second mold layer 376, the support layer 374, the first mold layer 372, and the etch stop layer 370 may be sequentially patterned to form electrode holes EH that expose the landing pads LP. A conductive layer may be formed to fill the electrode holes EH, and then an etch-back process or a chemical mechanical polishing process may be performed to remove the conductive layer on the second mold layer 376 and also to form the bottom electrode BE in the electrode hole EH. A third mask pattern 378 may be formed on the second mold layer 376. The third mask pattern 378 may have a plurality of openings 378h. The opening 378h may expose top surfaces of adjacent bottom electrodes BE and also expose the second mold layer 376 between the adjacent bottom electrodes BE.

Referring to FIG. 3P, an anisotropic etching process may be performed in which the third mask pattern 378 is used as an etching mask to remove the second mold layer 376 exposed to the opening 378h and also to remove the support layer 374 below the second mold layer 376. Accordingly, the support pattern 374a may be formed, and the first mold layer 372 below the opening 378h may be exposed.

Referring to FIG. 3Q, the third mask pattern 378 may be removed to expose the second mold layer 376. An isotropic etching process may be performed in which the first and second mold layers 372 and 376 are all removed to expose surfaces of the bottom electrode BE, the support pattern 374a, and the etch stop layer 370.

Referring to FIG. 3R, the dielectric layer DL may be formed on the exposed surface of the bottom electrode BE. In this case, the dielectric layer DL may also be formed on exposed surfaces of the support pattern 374a and the etch stop layer 370. The interface layer IFt may be formed on the dielectric layer DL. The interface layer IFt may correspond to the interface layer 40 discussed with reference to FIGS. 1A to 1C.

The description of the interface layer 40 in FIGS. 1A to 1C is applicable identically or similarly to the interface layer IFt. For example, the interface layer IFt may include a metal oxide (e.g., TiOx), and further include an additional metallic constituent (e.g., aluminum (Al)) or a semiconductor constituent (e.g., silicon (Si)). The additional constituent may have an amount of about 5 at % or less, based on a total amount of the interface layer IFt.

The interface layer IFt may have a bulk structure in which the additional constituent has a uniform or non-uniform concentration. Alternatively, the interface layer IFt may have a laminated structure including a stacked structure of a plurality of layers having the same constituent or different constituents.

Referring back to FIG. 2B, the top electrode TE may be formed on the interface layer IFt, covering the bottom electrodes BE. Therefore, the semiconductor memory device 1000 may be fabricated with the capacitor CAP having the bottom electrode BE, the top electrode TE, the dielectric layer DL between the bottom and top electrodes BE and TE, and the interface layer IFt between the top electrode TE and the dielectric layer DL.

The capacitor CAP may correspond to the capacitor 1 of FIG. 1A. The description of the capacitor 1 in FIGS. 1A to 1C is applicable identically or similarly to the capacitor CAP. For example, as discussed above with reference to FIG. 1A, charges may be prevented from moving through a grain boundary of the interface layer IFt, and as a result the capacitor 1 may have high capacitance.

Figure 4A:
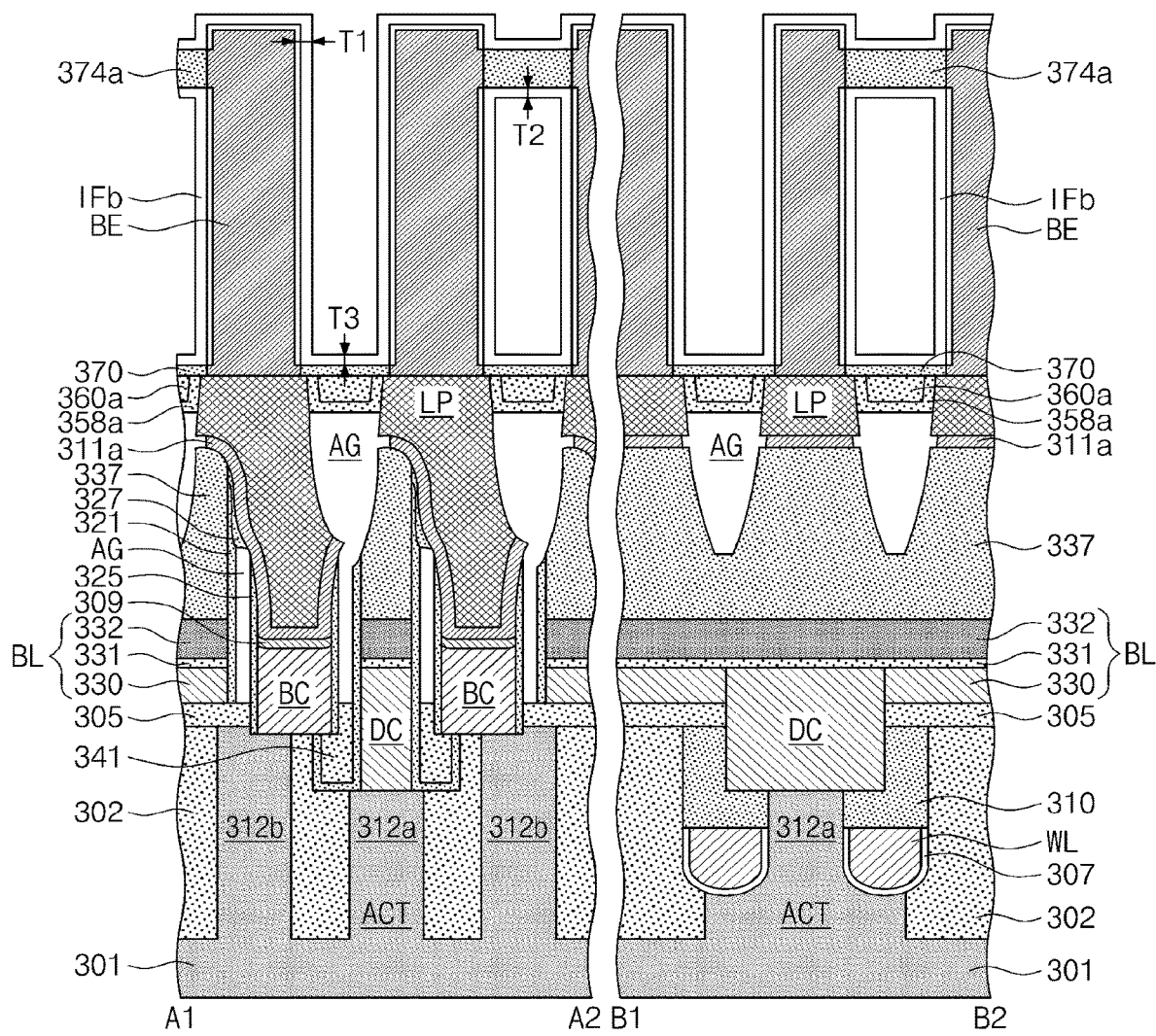
FIGS. 4A to 4C illustrate cross-sectional views along lines A1-A2 and B1-B2 of FIG. 2A, showing stages in a method of fabricating a semiconductor memory device that includes a capacitor according to some example embodiments.
Figure 4B:
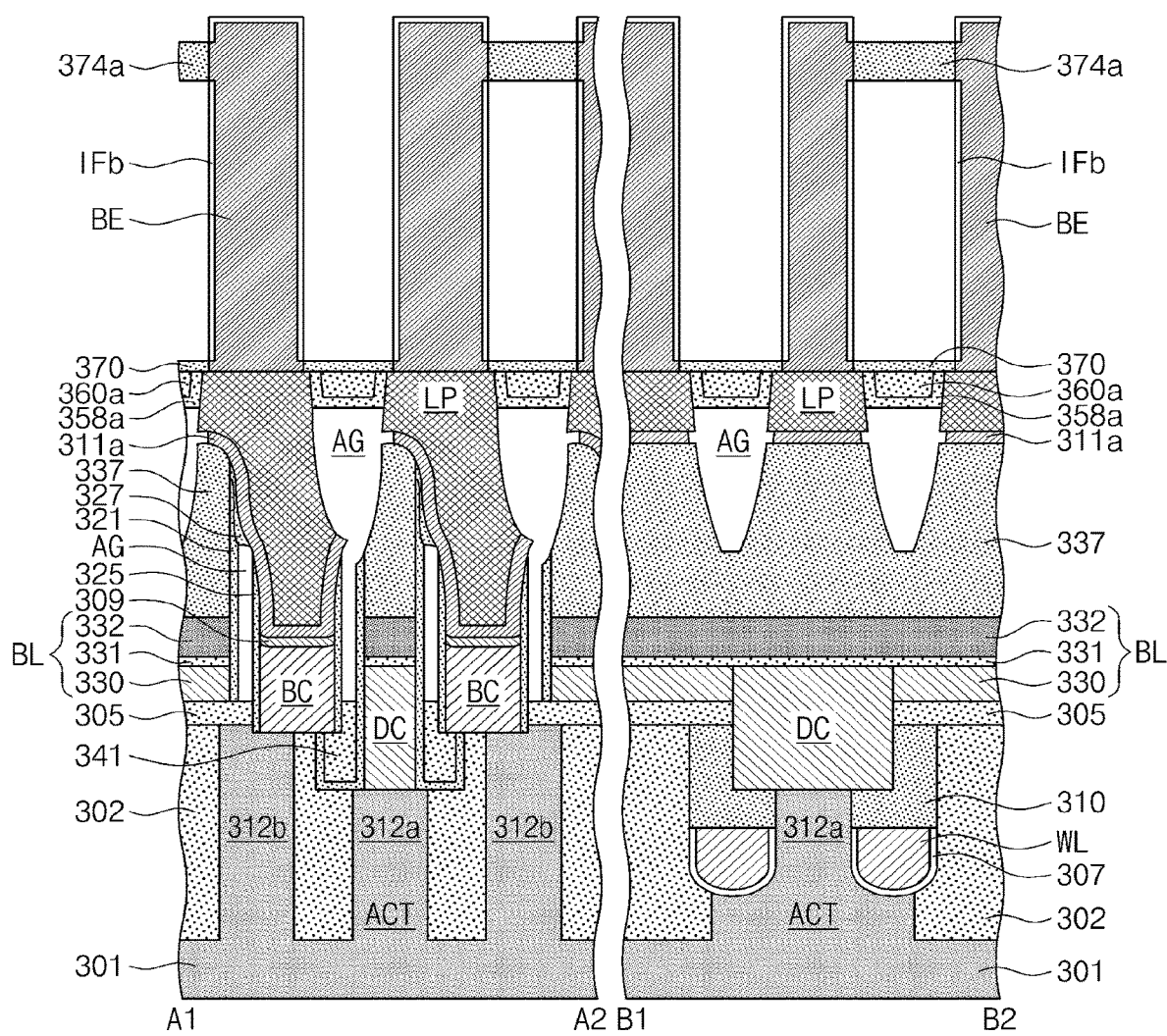
Figure 4C:
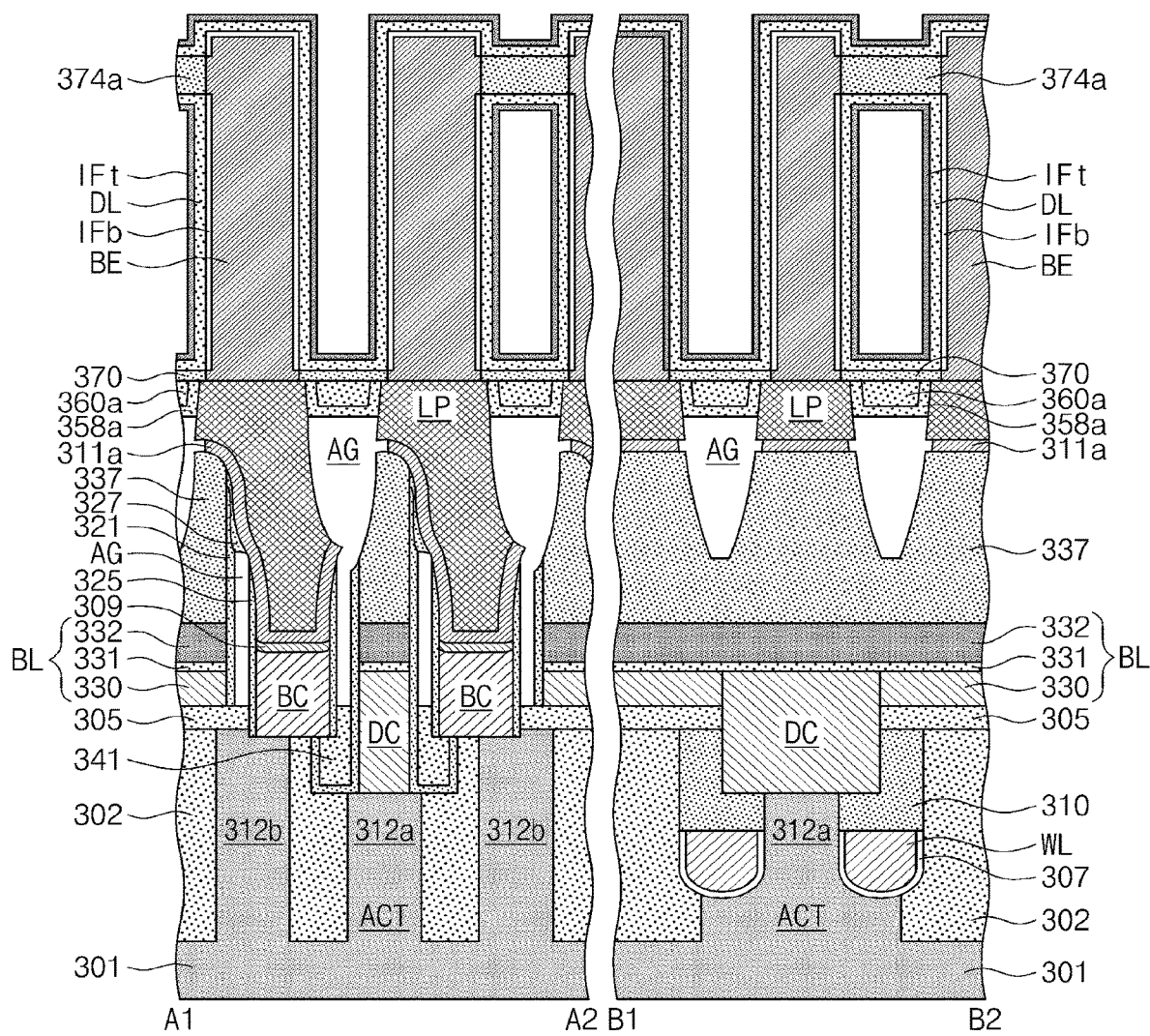

FIGS. 4A to 4C illustrate cross-sectional views along lines A1-A2 and B1-B2 of FIG. 2A, showing stages in a method of fabricating a semiconductor memory device that includes a capacitor according to some example embodiments.

Referring to FIG. 4A, surfaces of the bottom electrodes BE may be exposed by the processes discussed in FIGS. 3A to 3Q. An interface layer IFb may be formed on the exposed surface of the bottom electrode BE. In this case, the interface layer IFb may also be formed on the exposed surface of the support pattern 374a and on the exposed surface of the etch stop layer 370. When the interface layer IFb is formed, a constituent of the interface layer IFb may diffuse into the bottom electrode BE. Thus, a portion of the bottom electrode BE may be changed into the interface layer IFb. In another example, a deposition condition may be controlled such that the interface layer IFb is deposited at a relatively high rate on the bottom electrode BE and at a relatively low rate on the support pattern 374a and the etch stop layer 370.

The interface layer IFb may have a thickness that is non-uniform due to a difference in diffusion rate or deposition rate. For example, the interface layer IFb may have a first thickness T1 on the bottom electrode BE, a second thickness T2 on the support pattern 374a, and a third thickness T3 on the etch stop layer 370. The second thickness T2 may be less than the first thickness T1, and the third thickness T3 may be less than the first thickness T1 and identical or similar to the second thickness T2.

The interface layer IFb may correspond to the interface layer 20 discussed above with reference to FIG. 1D. The description of the interface layer 20 of FIG. 1D is applicable identically or similarly to the interface layer IFb. For example, the interface layer IFb may include a metal oxide (e.g., TiOx), and further include an additional metallic constituent (e.g., aluminum (Al)) or a semiconductor constituent (e.g., silicon (Si)). The additional constituent may have an amount of about 5 at % or less, based on a total amount of the interface layer IFb, and may prevent charges from moving through a grain boundary of the interface layer IFb. The interface layer IFb may have a bulk structure in which the additional constituent has a uniform or non-uniform concentration. Alternatively, the interface layer IFb may have a laminated structure in which are stacked a plurality of layers having the same constituent or different constituents.

Referring to FIG. 4B, an etching process may be performed to remove a portion of the interface layer IFb. When the interface layer IFb has semiconductor properties, neighboring bottom electrodes BE may be electrically connected to each other. Therefore, the interface layer IFb may be partially removed on the support pattern 374a and the etch stop layer 370, e.g., the interface layer IFb may include discontinuous portions separated by the support pattern 374a. In some embodiments, the etching process may be performed without an etching mask.

As discussed above, because the interface layer IFb has a relatively larger thickness (e.g., T1) on the bottom electrode BE and relatively smaller thicknesses (e.g., T2 and T3) on the support pattern 374a and the etch stop layer 370, the interface layer IFb may remain on the bottom electrode BE even if the etching process is performed without an etching mask.

Referring to FIG. 4C, the dielectric layer DL may be formed on the interface layer IFb, and the interface layer IFt may be formed on the dielectric layer DL. The dielectric layer DL may cover the interface layer IFb, the support pattern 374a, and the etch stop layer 370. The dielectric layer DL corresponds to the dielectric layer 30 of FIG. 1A. The description of the dielectric layer 30 of FIG. 1A is applicable identically or similarly to the dielectric layer DL. The dielectric layer DL may include an oxide layer of hafnium (Hf), niobium (Nb), titanium (Ti), tantalum (Ta), zirconium (Zr), chromium (Cr), cobalt (Co), iridium (Ir), molybdenum (Mo), osmium (Os), rhenium (Re), rhodium (Rh), ruthenium (Ru), tungsten (W), vanadium (V), or any combination thereof.

The interface layer IFt corresponds to the interface layer 40 discussed with reference to FIGS. 1A to 1C. The description of the interface layer 40 in FIGS. 1A to 1C is applicable identically or similarly to the interface layer IFt. For example, the interface layer IFt may include a metal oxide (e.g., TiOx), and further include an additional metallic constituent (e.g., aluminum (Al)) or a semiconductor constituent (e.g., silicon (Si)). The additional constituent may have an amount of about 5 at % or less, based on a total amount of the interface layer IFt, and may prevent charges from moving through a grain boundary of the interface layer IFt. The interface layer IFt may have a bulk structure in which the additional constituent has a uniform or non-uniform concentration. Alternatively, the interface layer IFt may have a laminated structure in which are stacked a plurality of layers having the same constituent or different constituents.

Referring back to FIG. 2C, the top electrode TE may be formed on the interface layer IFt, covering the bottom electrodes BE. Accordingly, the semiconductor memory device 1000 may be fabricated with the capacitor CAP including the bottom electrode BE, the top electrode TE, the dielectric layer DL between the bottom and top electrodes BE and TE, the interface layer IFb between the bottom electrode BE and the dielectric layer DL, and the interface layer IFt between the top electrode TE and the dielectric layer DL.

By way of summation and review, with the reduction in design rule of semiconductor memory devices, e.g., a dynamic random access memory (DRAM), the surface of a capacitor may be decreased, thereby causing reduced capacitance. Accordingly, the capacitor is required to have an improved structure to securely obtain high capacitance even if the semiconductor memory device is highly integrated.

Therefore, example embodiments provide a semiconductor memory device with increased reliability and a method of fabricating the same. Example embodiments also provide a semiconductor memory device with high capacitance and a method of fabricating the same.

That is, example embodiments provide a semiconductor memory device with a capacitor having a dielectric layer with an interface thereon that includes a metal oxide (e.g., $TiO_2$) doped with an additional constituent (e.g., aluminum) to supplement the interface (e.g., $TiO_2$) grain boundaries, thereby improving barrier/leakage characteristics of the interface. Accordingly, damage to the dielectric layer is substantially minimized or prevented in subsequent processes, thereby maintaining high capacitance of the capacitor and substantially minimizing or preventing leakage in the dielectric layer.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of fabricating a semiconductor memory device, the method comprising:
   providing a substrate having thereon bottom electrodes that are connected to each other through a support pattern;
   forming an etch stop layer on the substrate between the bottom electrodes;
   forming on the etch stop layer a dielectric layer that continuously extends along surfaces of the bottom electrodes and a surface of the support pattern;
   forming on the dielectric layer an upper interface layer that continuously extends along the bottom electrodes and the support pattern; and
   forming on the upper interface layer a top electrode that covers the bottom electrodes,
   wherein the upper interface layer includes a first metal oxide and a first additional constituent doped into the first metal oxide, the first additional constituent being present at a grain boundary of the first metal oxide.

2. The method as claimed in claim 1, wherein the first metal oxide includes titanium oxide, and the first additional constituent includes aluminum, silicon, or a combination thereof and has a maximum amount of about 5 at %, based on a total amount of the upper interface layer.

3. The method as claimed in claim 1, wherein forming the upper interface layer includes:
   forming a titanium oxide layer on the dielectric layer; and
   doping aluminum into the titanium oxide layer simultaneously with forming the titanium oxide layer.

4. The method as claimed in claim 1, wherein forming the upper interface layer includes alternately and repeatedly forming a titanium oxide layer and an aluminum-containing layer on the dielectric layer, the aluminum-containing layer includes $Al_2O_3$, AlN, AlC, or any combination thereof.

5. The method as claimed in claim 1, wherein the etch stop layer and the support pattern each includes a silicon nitride layer.

6. The method as claimed in claim 1, wherein forming the upper interface layer includes:
   forming a titanium oxide layer on the dielectric layer; and
   forming an aluminum oxide layer on the titanium oxide layer, such that aluminum of the aluminum oxide layer is doped into the titanium oxide layer.

7. The method as claimed in claim 6, wherein the aluminum has a uniform concentration in the upper interface layer.

8. The method as claimed in claim 6, wherein the aluminum has a concentration that gradually decreases as approaching the dielectric layer.

9. The method as claimed in claim 1, wherein, before forming the dielectric layer, forming a lower interface layer on the bottom electrodes, such that the lower interface layer includes a second metal oxide and a second additional constituent at a grain boundary of the second metal oxide.

10. The method as claimed in claim 9, wherein the second metal oxide includes titanium oxide, and the second additional constituent includes aluminum, silicon, or a combination thereof at a maximum amount of about 5 at %, based on a total amount of the lower interface layer.

11. A method of fabricating a semiconductor memory device, the method comprising:
    providing a substrate having thereon bottom electrodes that are connected to each other through a support pattern;
    forming on the bottom electrodes a lower interface layer that continuously extends along surfaces of the bottom electrodes and a surface of the support pattern;
    removing a portion of the lower interface layer from the surface of the support pattern, such that the lower interface layer remains on the bottom electrodes;
    forming on the lower interface layer a dielectric layer that continuously extends along the surfaces of the bottom electrodes and the surface of the support pattern;
    forming on the dielectric layer an upper interface layer that continuously extends along the bottom electrodes and the support pattern; and
    forming on the upper interface layer a top electrode that covers the bottom electrodes,
    wherein the upper interface layer includes a first titanium oxide and a first additional constituent at a grain boundary of the first titanium oxide, and
    wherein the lower interface layer includes a second titanium oxide and a second additional constituent at a grain boundary of the second titanium oxide.

12. The method as claimed in claim 11, wherein the first additional constituent includes aluminum, silicon, or a combination thereof and has a maximum amount of about 5 at %, based on a total amount of the upper interface layer.

13. The method as claimed in claim 11,
    wherein the second additional constituent includes aluminum, silicon, or a combination thereof and has a maximum amount of about 5 at %, based on a total amount of the lower interface layer.

* * * * *